US011605552B2

(12) United States Patent
Baloglu et al.

(10) Patent No.: US 11,605,552 B2
(45) Date of Patent: Mar. 14, 2023

(54) HYBRID PANEL METHOD OF MANUFACTURING ELECTRONIC DEVICES AND ELECTRONIC DEVICES MANUFACTURED THEREBY

(71) Applicants: Amkor Technology Singapore Holding Pte. Ltd., Singapore (SG); Amkor Technology Portugal, S.A., Vila do Conde (PT)

(72) Inventors: Bora Baloglu, Oporto (PT); Suresh Jayaraman, Gilbert, AZ (US); Ronald Huemoeller, Gilbert, AZ (US); Andre Cardoso, Oporto (PT); Eoin O'Toole, Oporto (PT)

(73) Assignees: Amkor Technology Singapore Holding Pte. Ltd., Singapore (SG); Amkor Technology Portugal, S.A., Vila do Conde (PT)

( * ) Notice: Subject to any disclaimer, the term of this patent is extended or adjusted under 35 U.S.C. 154(b) by 0 days.

(21) Appl. No.: 17/165,303

(22) Filed: Feb. 2, 2021

(65) Prior Publication Data
US 2021/0265192 A1  Aug. 26, 2021

Related U.S. Application Data

(60) Provisional application No. 63/117,688, filed on Nov. 24, 2020, provisional application No. 62/980,118, filed on Feb. 21, 2020.

(51) Int. Cl.
*H01L 23/00* (2006.01)
*H01L 21/683* (2006.01)
*H01L 21/56* (2006.01)

(52) U.S. Cl.
CPC ......... *H01L 21/6836* (2013.01); *H01L 24/03* (2013.01); *H01L 21/561* (2013.01); *H01L 21/568* (2013.01); *H01L 2221/68359* (2013.01); *H01L 2221/68372* (2013.01); *H01L 2221/68381* (2013.01); *H01L 2224/0231* (2013.01); *H01L 2224/02379* (2013.01); *H01L 2224/02381* (2013.01); *H01L 2224/0401* (2013.01)

(58) Field of Classification Search
CPC ... H01L 21/6836; H01L 24/03; H01L 21/561; H01L 21/568; H01L 2221/68359; H01L 2221/68372; H01L 2221/68381; H01L 2224/0231; H01L 2224/02379; H01L 2224/02381; H01L 2224/0401; H01L 24/20; H01L 24/19; H01L 24/96; H01L 2224/19
See application file for complete search history.

(56) References Cited

U.S. PATENT DOCUMENTS 6,130,473 A    10/2000  Mostafazadeh et al.
8,362,612 B1    1/2013  Paek et al.
(Continued)

*Primary Examiner* — Thanh T Nguyen
(74) *Attorney, Agent, or Firm* — McAndrews, Held & Malloy, Ltd.

(57) ABSTRACT

A hybrid panel method of (and apparatus for) manufacturing electronic devices, and electronic devices manufactured thereby. As non-limiting examples, various aspects of this disclosure provide a method of manufacturing an electronic device, where the method comprises mounting a plurality of subpanels to a panel, processing the subpanels as a panel, and removing the plurality of subpanels from the panel.

17 Claims, 18 Drawing Sheets

(56) References Cited

U.S. PATENT DOCUMENTS

| | | |
|---|---|---|
| 9,378,983 B2 | 6/2016 | Choi et al. |
| 9,543,242 B1 | 1/2017 | Kelly et al. |
| 2006/0013680 A1 | 1/2006 | Haba et al. |
| 2008/0157358 A1 | 7/2008 | Yang |
| 2010/0301474 A1 | 12/2010 | Yang |
| 2011/0053318 A1 | 3/2011 | Hu |
| 2012/0187568 A1* | 7/2012 | Lin ..................... H01L 23/5389 |
| | | 257/E23.174 |
| 2014/0077361 A1 | 3/2014 | Lin et al. |
| 2015/0243575 A1* | 8/2015 | Strothmann ............ H01L 24/96 |
| | | 257/734 |
| 2015/0255431 A1 | 9/2015 | Su et al. |
| 2015/0318262 A1 | 11/2015 | Gu et al. |
| 2017/0117200 A1 | 4/2017 | Kim et al. |
| 2017/0141046 A1 | 5/2017 | Jeong et al. |
| 2017/0250158 A1 | 8/2017 | Chinnusamy et al. |
| 2018/0012776 A1 | 1/2018 | Ross et al. |
| 2018/0114749 A1 | 4/2018 | Dimaano, Jr. et al. |
| 2019/0006195 A1* | 1/2019 | Qu .......................... H01L 24/13 |
| 2019/0103365 A1 | 4/2019 | Singh et al. |
| 2020/0075540 A1 | 3/2020 | Lu et al. |
| 2020/0083189 A1* | 3/2020 | Chen ................... H01L 23/5389 |
| 2020/0185355 A1 | 6/2020 | Huemoeller |
| 2021/0066093 A1 | 3/2021 | Kim et al. |
| 2021/0265182 A1 | 8/2021 | Baloglu et al. |

\* cited by examiner

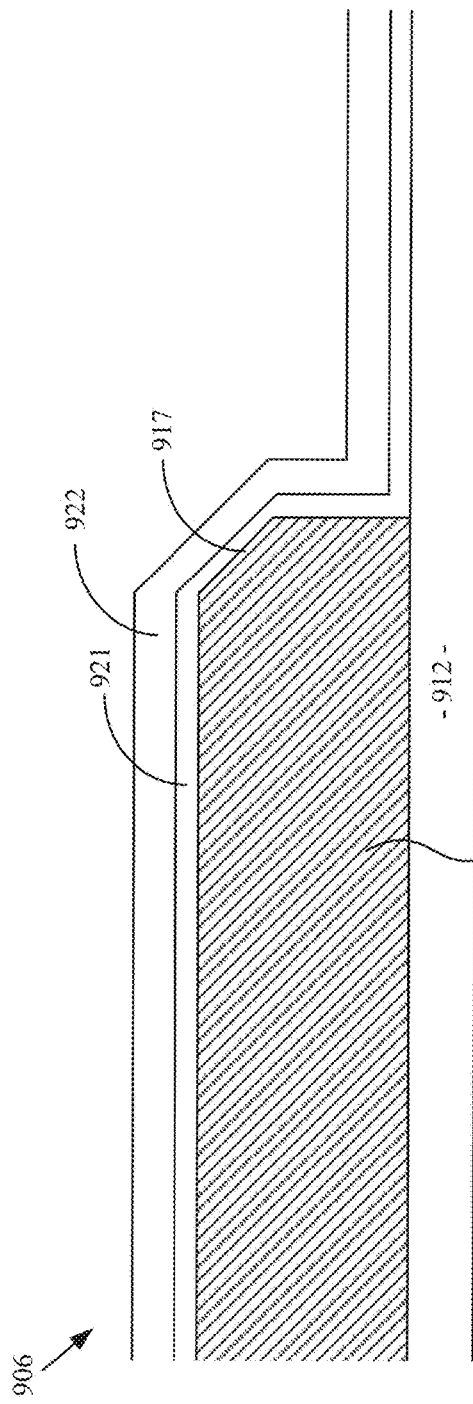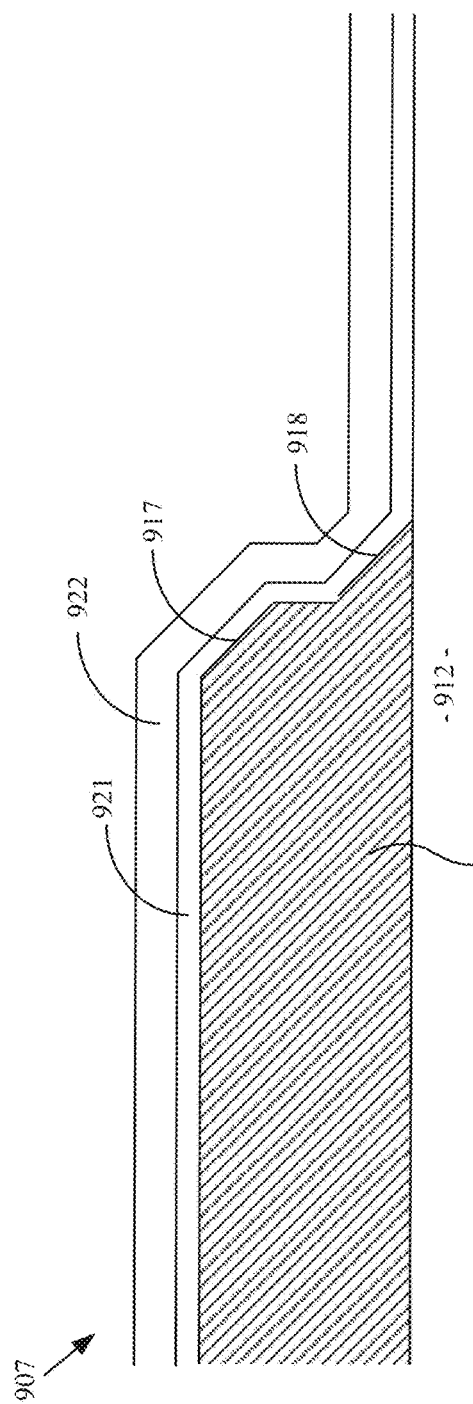

HYBRID PANEL METHOD OF MANUFACTURING ELECTRONIC DEVICES AND ELECTRONIC DEVICES MANUFACTURED THEREBY

CROSS-REFERENCE TO RELATED APPLICATIONS/INCORPORATION BY REFERENCE

This application makes reference to, claims priority to, and claims benefit from U.S. Provisional Application Ser. No. 63/117,688, filed on Nov. 24, 2020, and titled "Hybrid Panel Method of Manufacturing Electronic Devices and Electronic Devices Manufactured Thereby"; and from U.S. Provisional Application Ser. No. 62/980,118, filed on Feb. 21, 2020, and titled "Hybrid Panel Method of Manufacturing Electronic Devices and Electronic Devices Manufactured Thereby," the entire contents of which are hereby incorporated herein by reference.

Various aspects of this application are related to U.S. patent application Ser. No. 16/534,814, filed Aug. 7, 2019, and titled "Semiconductor Device and Method of Manufacturing a Semiconductor Device"; U.S. patent application Ser. No. 16/260,674, filed Jan. 29, 2019, and titled "Semiconductor Package and Fabricating Method Thereof"; and U.S. patent application Ser. No. 17/028,621, filed Sep. 22, 2020, and titled "Semiconductor Package and Fabricating Method Thereof"; the entire contents of each of which are hereby incorporated herein by reference.

BACKGROUND

Present semiconductor packages and methods of forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

BRIEF DESCRIPTION OF SEVERAL VIEWS OF THE DRAWINGS

FIGS. 9A-9E show an example method of processing a hybrid panel, for example comprising forming a signal redistribution structure, and example electronic devices produced thereby.

SUMMARY

Figure 1:
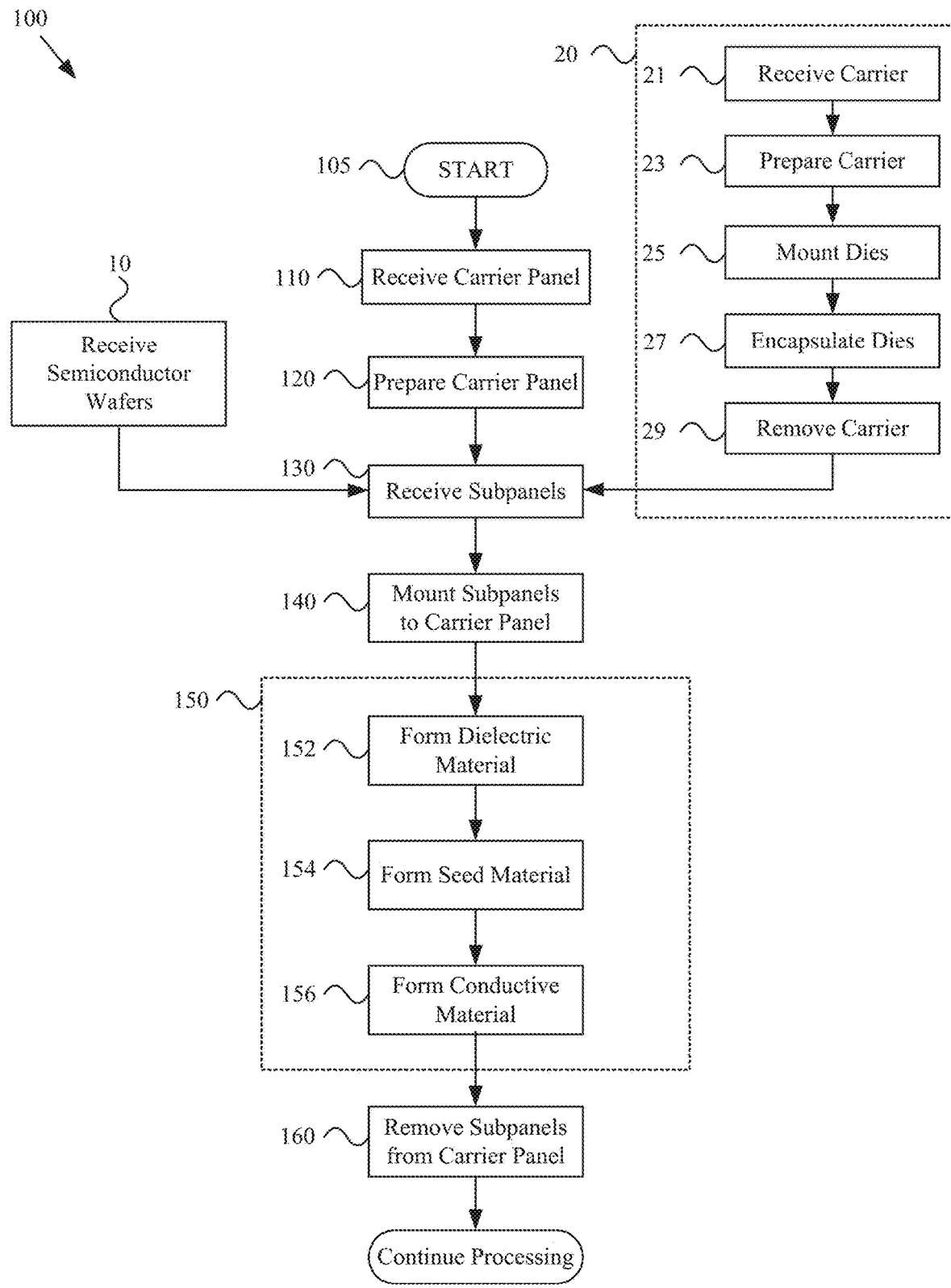
FIG. 1 shows a flow diagram of an example method of making an electronic device.

Various aspects of this disclosure provide a hybrid panel method of (and apparatus for) manufacturing electronic devices, and electronic devices manufactured thereby. As non-limiting examples, various aspects of this disclosure provide a method of manufacturing an electronic device, where the method comprises mounting a plurality of subpanels to a panel, processing the subpanels as a hybrid panel, and removing the plurality of subpanels from the panel.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." Similarly, as utilized herein, "or" means any one or more of the items in the list joined by "or".

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, or components, but do not preclude the presence or addition of one or more other features, integers, steps, operations, elements, components, or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper,"

"lower," "lateral," "side," "top," "bottom," and the like, may be used in distinguishing one element from another element in a relative manner. It should be understood, however, that components may be oriented in different manners, for example a semiconductor device or package may be turned sideways so that its "top" surface is facing horizontally and its "lateral" or "side" surface is facing vertically, without departing from the teachings of the present disclosure.

Various aspects of the present disclosure provide a semiconductor device or package and a fabricating (or manufacturing) method thereof, which can for example decrease the cost, increase the reliability, or increase the manufacturability of the semiconductor device or package.

Current processes for manufacturing electronic devices, such as electronic component packages, present various challenges. For example, manufacturing efficiency can generally be improved. For example, processing individual subpanels (e.g., wafers, reconstituted wafers, etc.) sequentially, rather than in parallel, may be associated with sequential inefficiency, for example in terms of increased product handling on a manufacturing line. Also for example, processing individual subpanels (e.g., wafers, reconstituted wafers, etc.) sequentially may be associated with relatively low cost and high quality, for example leveraging the utilization of equipment that has already been purchased and fine-tuned for such purpose. Additionally for example, processing large panels may be associated with efficiency of parallel processing and the increased cost of new and specialized equipment. Various aspects of the present disclosure thus provide an efficient method of manufacturing electronic components that utilizes a hybrid panel structure. Such a structure, for example, provides for increased manufacturing efficiency without incurring the substantial costs associated with new and customized manufacturing equipment (e.g., throughout an entire manufacturing line).

The above and other aspects of the present disclosure will be described in or be apparent from the following description of various example implementations. Various aspects of the present disclosure will now be presented with reference to accompanying drawings, such that those skilled in the art may readily practice the various aspects.

FIG. 1 shows a flow diagram of an example method 100 of making an electronic device (e.g., a semiconductor package, etc.). The example method 100 may, for example, share any or all characteristics with any other example method(s) discussed herein. It should be noted that the order of the example blocks of the method 100 may vary without departing from the scope of this disclosure. It should also be noted that one or more of the example blocks may be eliminated, and that one or more example blocks may be added without departing from the scope of this disclosure. It should additionally be noted that the order of the example blocks may be changed without departing from the scope of this disclosure.

The example method 100 may begin executing at block 105. The method 100 may begin executing in response to any of a variety of causes or conditions, non-limiting examples of which are provided herein. For example, the method 100 may begin executing automatically in response to one or more signals received from one or more upstream or downstream manufacturing stations, in response to a signal from a central manufacturing line controller, upon arrival of components or manufacturing materials utilized during performance of the method 100, etc. Also, for example, the method 100 may begin executing in response to an operator command to begin. Additionally, for example, the method 100 may begin executing in response to receiving execution flow from any other method block (or step) discussed herein.

At block 110, the example method 100 comprises receiving a carrier panel, which may also be referred to herein as a panel or frame. The carrier panel may, for example, comprise a carrier panel to which a plurality of subpanels are to be mounted (e.g., at block 140) to form a hybrid panel.

The carrier panel may comprise a plurality of characteristics. For example, a carrier panel may have any of a variety of shapes. The carrier panel may, for example, be rectangular. The carrier panel may also, for example, be square, n-polygonal where n is an integer greater than 2, elliptical, circular, etc. As will be discussed herein in more detail, the carrier top surface or bottom surface may be entirely planar, or the carrier top or bottom surface may have recesses or apertures (e.g., for the accommodation of subpanels).

The carrier panel may, for example, be made of (or comprise) any of a variety of materials. For example, the carrier panel may made of (or comprise) metal (e.g., stainless steel, etc.). Also for example, the carrier panel may be made of (or comprise) glass (e.g., transparent glass, etc.). Additionally for example, the carrier panel may be made of (or comprise) ceramic. Further for example, the carrier panel may be made of (or comprise) semiconductor material (e.g., silicon, gallium arsenide, etc.). In an example implementation, the carrier panel may be formed of a material having a coefficient of thermal expansion (CTE) that is the same as or substantially the same as (e.g., within 5%, within 10%, within 25%, etc.) the CTE of subpanels that are to be mounted to the carrier panel (e.g., at block 140). In another example implementation, the carrier panel may be formed of a material having a CTE that is within 50% of the CTE of the subpanels that are to be mounted to the carrier panel.

The carrier panel may, for example, provide structural support throughout processing (e.g., as performed at block 150, etc.) performed on the subpanels mounted (or coupled) thereto or performed on the carrier panel. For example, the carrier panel may be formed to withstand temperatures experienced during such processing, for example during the forming of various signal redistribution structures (e.g., temperatures reaching or exceeding 230 degrees Celsius for two or three or more hours), without compromising its basic function of providing support and stability during manufacturing. Also for example, the carrier panel may be formed to withstand chemical exposures experienced during such processing, for example during the forming of various signal redistribution structures or other processes (e.g., PGMEA, TMAH, Cyclopentanone, sulphuric acid, hydrofluoric acid (0.5%), etc.) without compromising its basic function of providing support and stability during manufacturing.

In general, block 110 may comprise receiving a carrier panel. Accordingly, the scope of this disclosure shall not be limited by particular characteristics of a carrier panel or of any particular manner of forming or receiving a carrier panel.

The example 100 may, at block 120, comprise preparing the received carrier panel, for example for the mounting of subpanels thereto, for manufacturing processes to which the carrier panel may be exposed, etc.

For example, block 120 may comprise cleaning the received carrier panel. Also for example, block 120 may comprise inspecting the received carrier panel to verify that the carrier panel meets manufacturing tolerances (e.g., size, flatness or planarity, thickness, CTE requirements, aperture requirements, transparency requirements, etc.). Additionally for example, block 120 may comprise verifying that the carrier panel has not been damaged during shipping or during previous manufacturing operations (e.g., in a scenario in which carrier panels are reused).

In general, block 120 may comprise preparing the received carrier panel. Accordingly, the scope of this disclosure shall not be limited by characteristics of any particular manner of preparing the received carrier panel.

The example method 100 may, at block 130, comprise receiving subpanels (e.g., one or more subpanels) for mounting to the carrier panel. Such receiving and such subpanels may comprise any of a variety of characteristics, many examples of which are provided herein.

Note that the term subpanels, as utilized herein, may refer to any of a variety of types of subpanels. For example, a subpanel may have any of a variety of shapes (e.g., circular, rectangular (e.g., a rectangular strip), square, n-polygonal with n being an integer greater than 2, elliptical, etc.).

A subpanel may comprise any of variety of forms. For example, a subpanel may comprise a semiconductor wafer (e.g., a wafer of integrated circuits output from a wafer fab process), an interposer wafer (e.g., with or without active or passive components integrated therein, etc.), etc.). Also for example, a subpanel may comprise a reconstituted wafer, which may comprise a plurality of dies that have been previously singulated and are now coupled to each other with a joining material (e.g., molding material, etc.). Additionally for example, a subpanel may comprise a substrate (e.g., cored or coreless substrate) or interposer. Such a substrate or interposer may, for example, be bare or may comprise electronic components (e.g., semiconductor components, active components, passive components, etc.) attached thereto.

As shown at block 10, the receiving at block 130 may comprise receiving subpanels in the form of semiconductor wafers (e.g., a wafer of integrated circuits), an interposer wafer (e.g., with or without active or passive components integrated therein, etc.), etc. Such receiving may, for example, comprise receiving a semiconductor wafer from a wafer fabrication facility, from an upstream process, etc. The wafer may, for example, be circular (e.g., having a diameter of 2", 4", 8", 12", 300 mm, etc.). The wafer may, for example, comprise any of a variety of semiconductor materials (e.g., Silicon (Si), Gallium Arsenide (GaAs), InP, etc.). The wafer may, for example, comprise microelectromechanical machine system (MEMS) components.

Also for example, as shown at block 20, the receiving at block 130 may comprise receiving subpanels in the form of reconstituted subpanels (e.g., circular wafers, rectangular or square subpanels, etc.). For example, block 130 may comprise receiving a molded wafer (e.g., as formed or received at block 20). Such a reconstituted subpanel may comprise any of a variety of dimensions, for example having a circular diameter or side length of 2", 4", 8", 12", 300 mm, etc.). A subpanel received at block 130 may, for example, comprise any of a variety of thicknesses (e.g., relatively thin and flexible, for example less than 100 μm thick, relatively thick and inflexible, for example greater than 300 μm, etc.).

In an example implementation, block 20 may comprise forming a reconstituted wafer. Block 20 will now be discussed with reference to FIGS. 2A-2E (e.g., showing a so-called face-down or front-side-down or active-side-down forming) and with reference to FIGS. 3A-3F (e.g., showing a so-called face-up or front-side-up or active-side-up forming).

Figure 2A:
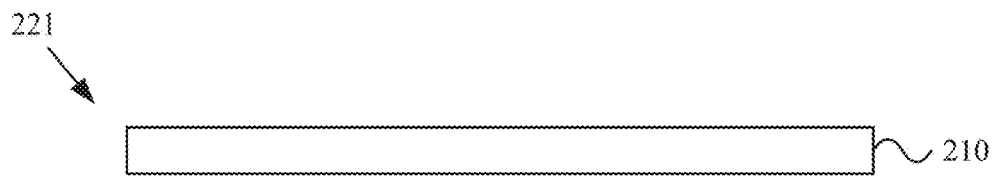
FIGS. 2A-2E show cross-sectional views illustrating an example method of making a subpanel of electronic devices, and an example subpanel of electronic devices produced thereby.

Referring now to block 20 and FIGS. 2A-2E, block 21 may comprise receiving a carrier. An example 221 of block 21 is shown at FIG. 2A. Such receiving may be performed in any of a variety of manners, various examples of which are provided herein. The example carrier 210 may comprise any of a variety of characteristics. The example carrier 210 may, for example, be circular, rectangular, shaped like the reconstituted subpanel to be formed thereon etc.). The example carrier 210 may, for example, comprise glass, semiconductor material (e.g., silicon, etc.), metal (e.g., stainless steel, etc.), ceramic, etc.

Figure 2B:
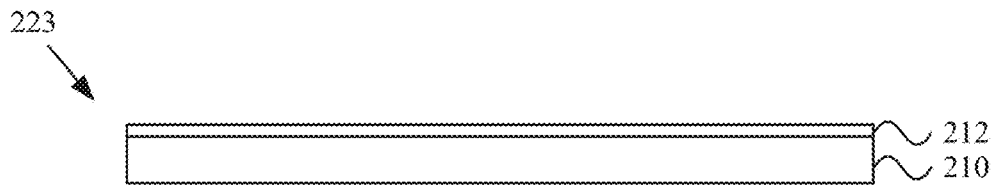

Block 23 may, for example, comprise preparing the carrier (e.g., for the mounting step to be performed at block 25, etc.). Such preparing may be performed in any of a variety of manners, various examples of which are provided herein. For example, block 23 may comprise cleaning the received carrier, preparing the carrier for the application of various materials thereon, etc. An example 223 of block 23 is shown at FIG. 2B. In the example 223, an adhesive material 212 (e.g., a layer of adhesive material) is formed on the carrier 210 (e.g., on a top side thereof). The adhesive material 212 may comprise any of a variety of characteristics, non-limiting examples of which are discussed herein. The adhesive material 212 may, for example, comprise a thermal-releasable adhesive, a light-releasable adhesive (e.g., UV-releasable, etc.), a die-attach film, etc. The adhesive material 212 may be formed in any of a variety of manners, for example, printing, spraying, applying or laminating a preformed adhesive tape or film, spin-coating, vapor-depositing, etc.

The adhesive material 212 (or the forming thereof) may, for example, share characteristics with any of the adhesive materials (or the forming thereof) discussed herein (e.g., discussed herein with regard to mounting subpanels to the carrier panel, discussed herein with regard to forming dielectric materials, etc.).

Figure 2C:
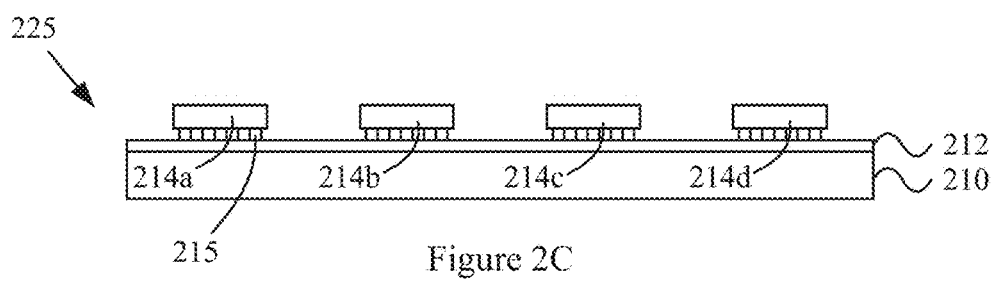

Block 25 may, for example, comprise mounting semiconductor dies (or any electrical circuit, MEMS circuit, etc.) to the carrier. Such mounting may be performed in any of a variety of manners, various examples of which are provided herein. An example 225 of block 25 is shown at FIG. 2C. In the example 225, a plurality of semiconductor dies 214a, 214b, 214c, and 214d are applied and adhered to the adhesive material 212. The example dies 214a-214d are shown mounted in a face-down configuration, for example, with the front sides of the dies 214a-214d (or interconnection structures at the front sides of the dies 214a-214d) facing the adhesive material 212 and the carrier 210. In some examples, the front sides of the dies 214a-214d can comprise or be referred to as active sides or interconnect sides of the dies 214a-214d. The example dies 214a-214d may, for example, be placed or pressed onto the adhesive material 212 with a pick-and-place machine. In some examples, interconnection structures 215 (e.g., terminals, bond pads, pillars or posts, bumps, balls, etc.) can protrude such as to define a gap between the front sides of the dies 214a-214d and the adhesive material 212. In some examples, interconnection structures 215 can be substantially coplanar with the front sides of dies 214a-214d, or the front sides of dies 214a-214d can contact the adhesive material 212. In some examples, the interconnection structures 215 can be recessed into the front sides of the dies 214a-214d and may, but need not, contact the adhesive material 212.

Figure 2D:
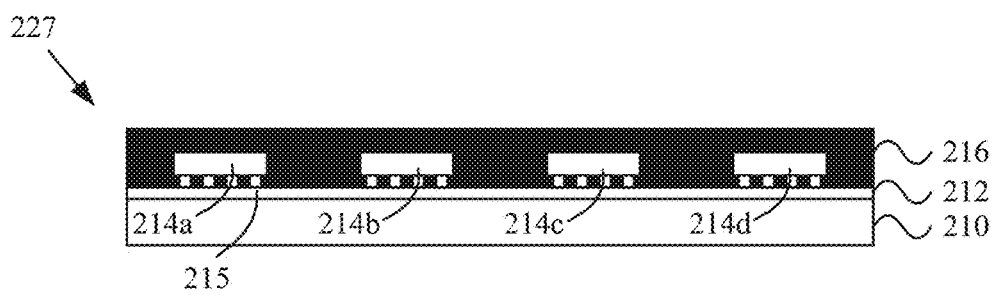

Block 27 may, for example, comprise encapsulating the mounted dies. Such encapsulating may be performed in any of a variety of manners, various examples of which are provided herein. An example 227 of block 27 is shown at FIG. 2D. In the example 227, an encapsulating material 216 is formed around the dies 214a-214d. In the example 227, the encapsulating material 216 is shown surrounding and contacting all sides of the dies 214a-214d (e.g., top side, bottom side, and lateral sides), but the scope of this disclosure is not limited to such coverage. For example, the front sides of the dies 214a-214d may be partially or entirely exposed from the encapsulating material 216. In an example implementation, a front side of the encapsulating material 216 and respective front sides of the dies 214a-214d may be coplanar or substantially coplanar (e.g., within a 5% height deviation from a reference plane at the bottom of the reconstituted subpanel, within a 10% height deviation from a reference plane at the bottom of the reconstituted subpanel, etc.). Also for example, although a portion of the encapsulating material 216 is shown below the dies 214a-214d (e.g., laterally contacting or surrounding interconnection structures 215 of the dies 214a-214d), such a configuration is not necessary. For example, the bottom sides of the dies 214a-214d may be free of the encapsulating material 216.

The encapsulating material 216 may comprise any of a variety of characteristics. For example, the encapsulating material 216 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The encapsulating material 216 may be formed in any of a variety of manners (e.g., compression molding, transfer molding, liquid encapsulant molding, vacuum laminating, paste printing, film assisted molding, film pressing, spin coating, spraying, etc.).

Figure 2E:
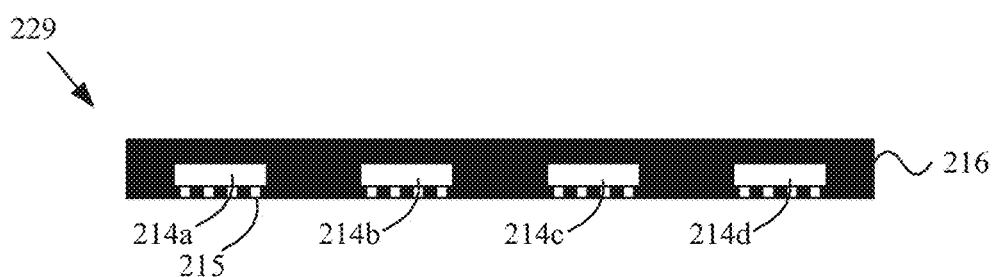

Block 29 may, for example comprise removing the carrier and the adhesive material. Such removing may be performed in any of a variety of manners, various examples of which are provided herein. An example 229 of block 29 is shown at FIG. 2E. The carrier 210 (e.g., a temporary carrier) or adhesive material 212 (e.g., a temporary adhesive material) may be removed by performing a grinding and etching process, by applying heat and pulling the carrier 210 and adhesive material 212 from the encapsulating material 216 and the dies 214a-214d, by illuminating the adhesive 212 through the carrier 210 and pulling the carrier 210 and adhesive material 212 from the encapsulating material 216 and the dies 214a-214d, by applying a shear force, etc.

As shown in the example 229 of FIG. 2E, after the removal of the carrier 210 and adhesive material 212, interconnection structures 215 (e.g., terminals, bond pads, pillars or posts, bumps, balls, etc.) at the bottom sides of the dies 214a-214d are exposed at a bottom surface of the encapsulating material 216.

Referring now to block 20 and FIGS. 3A-3F, another example method for forming a reconstituted subpanel is provided.

Figure 3A:
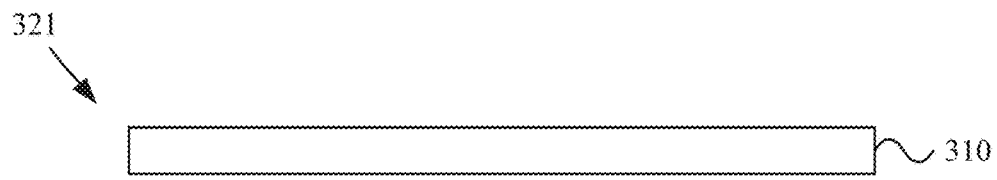
FIGS. 3A-3F show cross-sectional views illustrating an example method of making a subpanel of electronic devices, and an example subpanel of electronic devices produced thereby.

For example, block 21 may comprise receiving a carrier. An example 321 of block 21 is shown at FIG. 3A. Such receiving may be performed in any of a variety of manners, various examples of which are provided herein. The example carrier 310 may comprise any of a variety of characteristics. The example carrier 310 may, for example, be circular, rectangular, shaped like the reconstituted subpanel to be formed thereon etc.). The example carrier 310 may, for example, comprise glass, semiconductor material (e.g., silicon, etc.), metal (e.g., stainless steel, etc.), ceramic, etc.

Figure 3B:

Block 23 may, for example, comprise preparing the carrier (e.g., for the mounting step to be performed at block 25, etc.). Such preparing may be performed in any of a variety of manners, various examples of which are provided herein. For example, block 23 may comprise cleaning the received carrier, preparing the carrier for the application of various materials thereon, etc. An example 323 of block 23 is shown at FIG. 3B. In the example 323, an adhesive material 312 (e.g., a layer of adhesive material) is formed on the carrier 310 (e.g., on a top side thereof). The adhesive material 312 may comprise any of a variety of characteristics, non-limiting examples of which are discussed herein. The adhesive material 312 may, for example, comprise a thermal-releasable adhesive, a light-releasable adhesive (e.g., UV-releasable, etc.), a die-attach film, etc. The adhesive material 312 may be formed in any of a variety of manners, for example, printing, spraying, applying or laminating a preformed adhesive tape or film, spin-coating, vapor-depositing, etc.

The adhesive material 312 (or the forming thereof) may, for example, share characteristics with any of the adhesive materials (or the forming thereof) discussed herein (e.g., discussed herein with regard to mounting subpanels to the carrier panel, discussed herein with regard to forming dielectric materials, etc.).

Figure 3C:
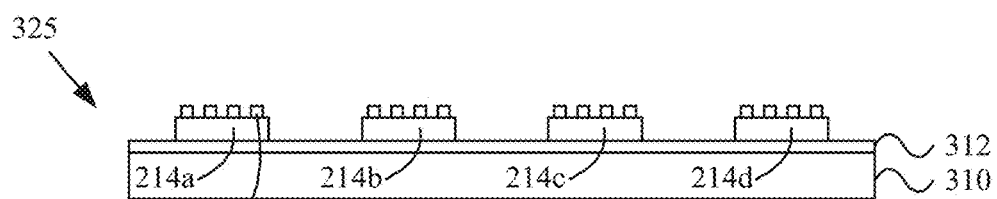

Block 25 may, for example, comprise mounting semiconductor dies (or any electrical circuit, MEMS circuit, etc.) to the carrier. Such mounting may be performed in any of a variety of manners, various examples of which are provided herein. An example 325 of block 25 is shown at FIG. 3C. In the example 325, a plurality of semiconductor dies 214a, 214b, 214c, and 214d are applied and adhered to the adhesive material 312. The example dies 214a-214d are shown being mounted in a face-up configuration, for example, with the front sides of the dies 214a-214d (or interconnection structures formed on the dies 214a-214d) facing upward or away from the adhesive material 312. The example dies 214a-214d may, for example, be placed or pressed with a pick-and-place machine. In some examples, interconnection structures 215 (e.g., terminals, bond pads, pillars or posts, bumps, balls, etc.) can protrude from the front sides of the dies 214a-214d. In some examples, interconnection structures 215 can be substantially coplanar with the front sides of the dies 214a-214d. In some examples, the interconnection structures 215 can be recessed into the front sides of the dies 214a-214d.

Figure 3D:
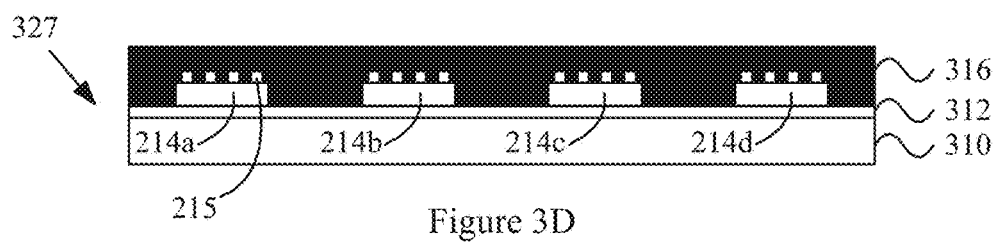
Figure 3E:
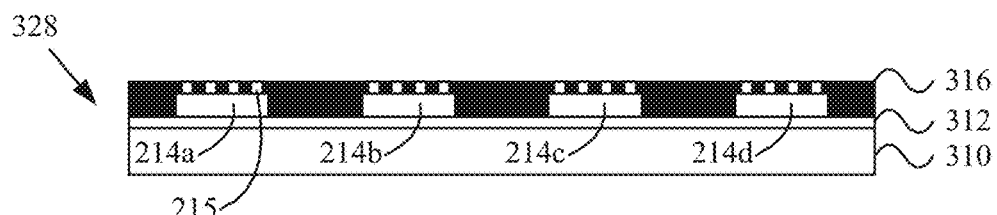

Block 27 may, for example, comprise encapsulating the mounted dies. Such encapsulating may be performed in any of a variety of manners, various examples of which are provided herein. An example 327 of block 27 is shown at FIGS. 3D and 3E. In the example 327, an encapsulating material 316 is formed around the dies 214a-214d. In the example 327, the encapsulating material 316 is shown surrounding and contacting lateral and front sides of the dies 214a-214d, but the scope of this disclosure is not limited to such coverage. For example, the front sides of the dies 214a-214d may be entirely exposed from the encapsulating material 316. For example, although a portion of the encapsulating material 316 is shown above the dies 214a-214d (e.g., laterally contacting and surrounding interconnection structures 215 of the dies 214a-214d), such a configuration is not necessary.

In an example implementation, the encapsulating material 316 and respective front sides of the dies 214a-214d (or of interconnection structures 215 thereon) may be coplanar or substantially coplanar (e.g., within a 5% height deviation from a reference plane at the bottom of the reconstituted subpanel, within a 10% height deviation from a reference plane at the bottom of the reconstituted subpanel, etc.).

The encapsulating material 316 may comprise any of a variety of characteristics. For example, the encapsulating material 316 may comprise any of a variety of encapsulating or molding materials (e.g., resin, polymer, polymer composite material, polymer with filler, epoxy resin, epoxy resin with filler, epoxy acrylate with filler, silicone resin, combinations thereof, equivalents thereof, etc.). The encapsulating material 316 may be formed in any of a variety of manners (e.g., compression molding, transfer molding, liquid encapsulant molding, vacuum laminating, paste printing, film assisted molding, film pressing, spin coating, spraying, etc.).

As shown in the example 328 shown at FIG. 3E, in a scenario in which the front sides of the dies 214a-214d (or interconnection structures 215 thereon) are covered by the encapsulating material 316, a thinning or planarizing process may be performed (e.g., grinding, etching, etc.) to thin the encapsulating material 316 (or interconnection structures 215) and expose the front sides of the dies 214a-214d or the top sides of interconnection structures 215 (e.g., terminals, bond pads, pillars or posts, bumps, balls, etc.) thereof. In an example implementation, a top side of the encapsulating material 316 and respective front sides of the dies 214a-214d or interconnection structures 215 may be coplanar or substantially coplanar (e.g., within a 5% height deviation from a reference plane at the bottom of the reconstituted panel, within a 10% height deviation from a reference plane at the bottom of the reconstituted panel, etc.). Note that such a thinning or planarizing process may also be performed in the example 227 of FIG. 2D to thin or planarize the encapsulating material 216 or front sides of the dies 214a-214b.

Figure 3F:
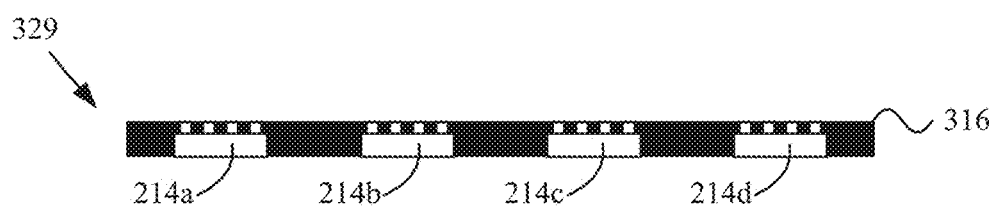

Block 29 may, for example comprise removing the carrier and the adhesive material. Such removing may be performed in any of a variety of manners, various examples of which are provided herein. An example 329 of block 29 is shown at FIG. 3F. The carrier 310 (e.g., a temporary carrier) or adhesive material 312 (e.g., a temporary adhesive material) may be removed by performing a grinding and etching process, by applying heat and pulling the carrier 310 and adhesive material 312 from the encapsulating material 316 and the dies 214a-214d, by illuminating the adhesive 312 through the carrier 310 and pulling the carrier 310 and adhesive material 312 from the encapsulating material 316 and the dies 214a-214d, by applying a shear force, etc.

As shown in the example 329 of FIG. 3F, after the removal of the carrier 310 and adhesive material 312, the back sides of the dies 214a-214d are exposed at a bottom surface of the encapsulating material 316. In an example implementation, a bottom side of the encapsulating material 316 and respective back sides of the dies 214a-214d may be coplanar or substantially coplanar (e.g., within a 5% height deviation from a reference plane at a top surface of the encapsulating material, within a 10% height deviation from a reference plane at a top surface of the encapsulating material, etc.).

In general, block 130 (FIG. 1) may comprise receiving subpanels. Accordingly, the scope of this disclosure should not be limited by characteristics of particular subpanels, manners of receiving subpanels, or manners of forming subpanels.

The example method 100 may, at block 140, comprise mounting subpanels (e.g., as received at block 130) to a carrier panel (e.g., as received and prepared at blocks 110 and 120). Block 140 may comprise mounting the subpanels to a carrier panel in any of a variety of manners, various examples of which are provided herein.

Figure 4:
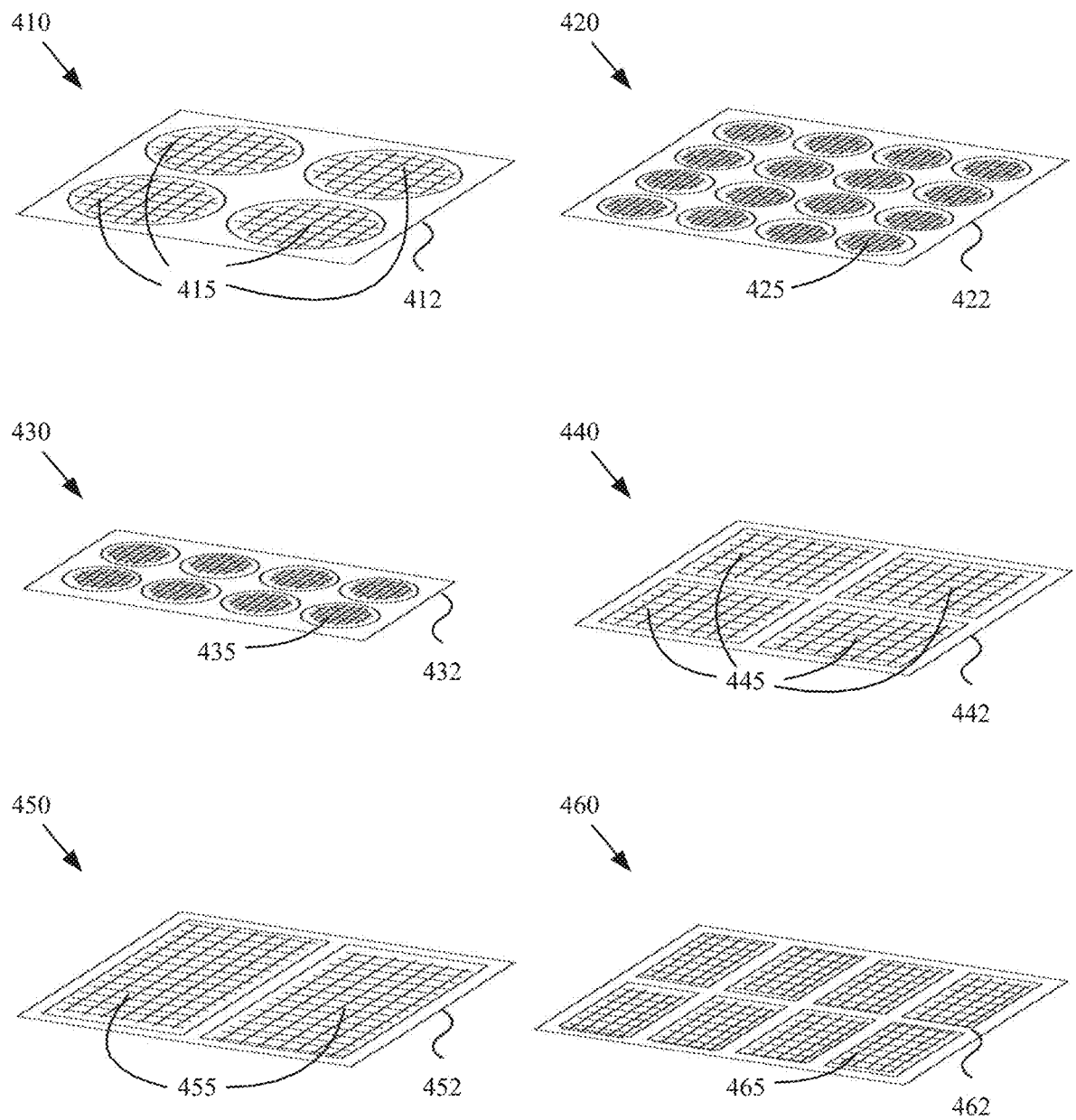
FIG. 4 shows example subpanel and panel configurations.

FIG. 4 provides various examples of subpanel/panel (or hybrid panel) configurations. In some implementations, such subpanels can comprise or correspond to other subpanels disclosed herein, such as the subpanels of FIGS. 2-3 comprising dies 214a-214d. For example, the example 410 shows a perspective view of a configuration comprising four circular subpanels 415 (e.g., wafers, reconstituted wafers, etc.) mounted to a square carrier panel 412. Also for example, example 420 shows a perspective view of a configuration comprising sixteen circular subpanels 425 (e.g., wafers, reconstituted wafers, etc.) mounted to a square carrier panel 422. Additionally for example, example 430 shows a perspective view of a configuration comprising eight circular subpanels 435 (e.g., wafers, reconstituted wafers, etc.) mounted to a rectangular and non-square panel 432.

As discussed herein, the subpanels may be square, rectangular, n-polygonal with n being an integer greater than two, etc. For example, the example 440 shows a perspective view of a configuration comprising four square subpanels 445 mounted to a square carrier panel 442. Also for example, the example 450 shows a perspective view of a configuration comprising two rectangular (e.g., non-square, or strip) subpanels 455 mounted to a square carrier panel 452. Additionally for example, the example 460 shows a perspective view of a configuration comprising eight rectangular (or square) subpanels 465 mounted to a rectangular (and non-square) carrier panel 462.

As shown in the various examples 410, 420, 430, 440, 450, and 460, the subpanels may be arranged in a matrix (or row/column) configuration on the carrier panel, for example with a same number of subpanels in the rows and columns, or with a different number of subpanels in the rows and columns. Note that such a matrix configuration is not necessary, and the scope of this disclosure covers any configuration. For example, subpanels may be arranged in a circular configuration, n-polygonal configuration with n being any integer greater than two, staggered configuration, etc.

Also, as shown in the various examples 410, 420, 430, 440, 450, and 460, the subpanels mounted to a particular carrier panel may all be identical or may be a same shape or size. The scope of this disclosure is not limited thereto. For example, subpanels of different shapes or sizes may be mounted to a same carrier panel. Also for example, subpanels of different types of dies (e.g., with the same or different size subpanel dimensions) may be mounted to a same carrier panel. Also, subpanels with different sizes or numbers of respective dies may be mounted to a same carrier panel.

Additionally, as shown in the various examples 410, 420, 430, 440, 450, and 460, the subpanels may be arranged on a carrier panel, such that the carrier panel extends laterally outward from the subpanels. For example, an outer perimeter region on the top side of the carrier panel may laterally surround the subpanels. Such an outer perimeter region on the top side of the carrier panel may, for example, be free of adhesive material. Such a configuration may, for example, be beneficial for a variety of reasons (e.g., for carrier panel handling, for carrier panel securing, for carrier panel alignment, for inspection, for processing uniformity, etc.).

As mentioned herein, various examples of the subpanel mounting of block 140 are provided herein. Three of such examples are shown in FIGS. 5, 6, and 7A-7B. Each of such examples will now be discussed.

Figure 5:
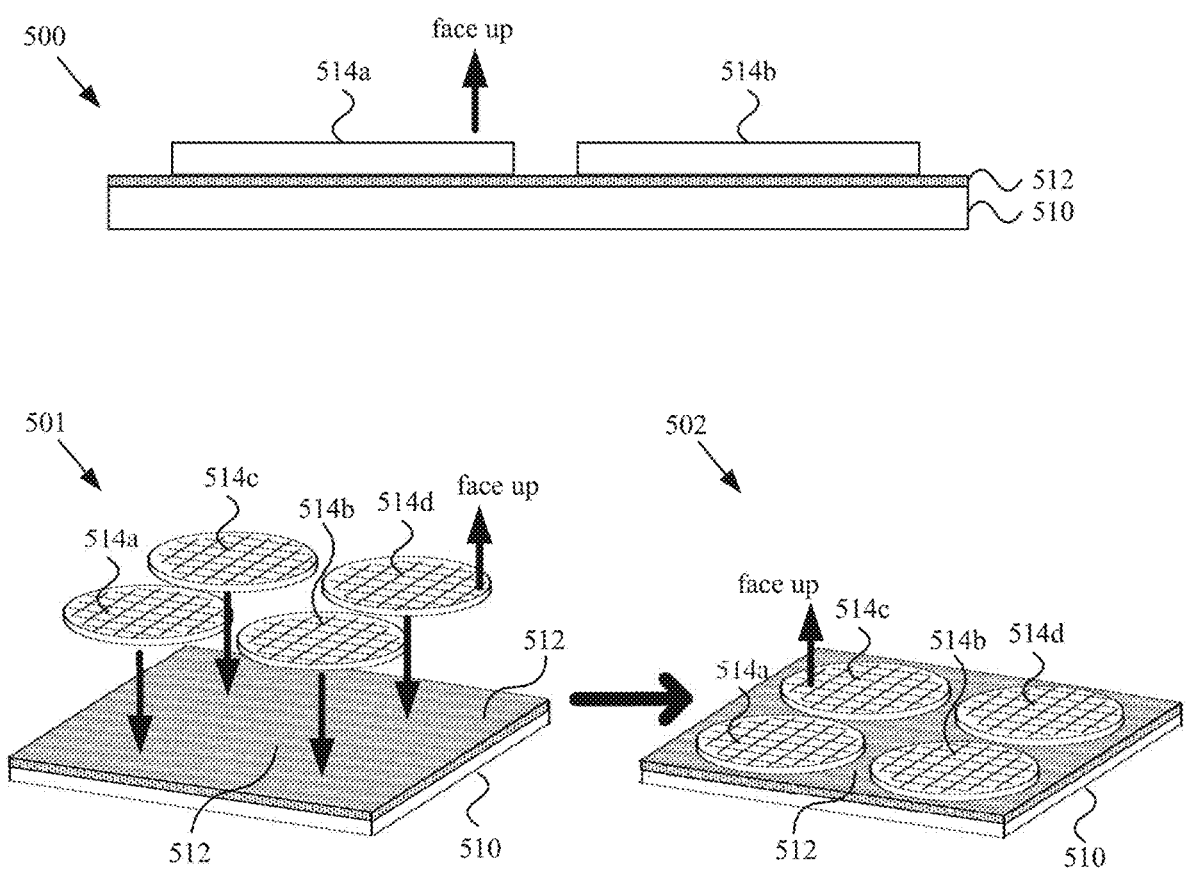
FIG. 5 shows a first example method of mounting subpanels to a panel, and example electronic devices produced thereby.

Turning first to FIG. 5, such figure shows a first example method of mounting subpanels to a panel, and example electronic devices produced thereby. In some implementations, such subpanels can comprise or correspond to other subpanels disclosed herein, such as the subpanels of FIGS. 2-3 comprising dies 214a-214d, such as the subpanels 415, 425, 435, 445, 455, and 465 of FIG. 4, etc. FIG. 5 shows a vertical cross-sectional view 500 and perspective views 501 and 501 of the first example method.

The example carrier panel 510 is provided. As discussed herein, the carrier panel 510 may comprise any of a variety of materials. For example, the carrier panel 510 may comprise metal (e.g., stainless steel, etc.), glass, ceramic, etc. In an example implementation, the carrier panel 510 may comprise glass through which light (e.g., UV radiation) may efficiently pass to a light-releasable adhesive thereon (e.g., glass or other material having a high transmittance at the relevant wavelengths, above 80%, above 90%, etc.). In another example implementation, the carrier panel 510 (or any carrier panel discussed herein) may comprise a metal or other conductive material through which thermal energy may efficiently pass to a thermal-releasable adhesive thereon.

Note that the example carrier panel 510 (or any example carrier panel discussed herein) may be formed of a material that has a same or substantially the same (e.g., within 5%, within 10%, etc.) coefficient of thermal expansion (CTE) as the subpanels to be mounted to the carrier panel 510. Also for example, the example carrier panel 510 (or any example carrier panel discussed herein) may be formed of a material that has a CTE within 25% or 50% of the CTEs of the subpanels to be mounted to the carrier panel 510.

An adhesive material 512 (e.g., an adhesive layer 512) is formed on the carrier panel 510. As discussed herein, the adhesive material 512 may comprise any of a variety of characteristics. For example, the adhesive material 512 may comprise a light-releasable adhesive, a thermal-releasable adhesive, a die-attach adhesive, a curable bonding agent, etc. As discussed herein, although the adhesive material 512 is shown covering an entire top side of the carrier panel 510, such coverage is not required. For example, a perimeter region on the top side of the carrier panel 510, or at one or more lateral (or horizontal) ends of the top side of the carrier panel 510, may remain free of the adhesive material 512 (e.g., for handling, for securing, for aligning, etc.).

The adhesive material 512 may be formed in any of a variety of manners (e.g., rolling on, printing, spraying one or multiple coats, applying or laminating a preformed adhesive tape or film, spin-coating, dipping, etc.). In an example implementation, a preformed adhesive sheet 512 (or tape or film) may be rolled on the top side of the carrier panel 510.

Note that although the example mounting shown in FIG. 5 forms the adhesive material 512 on the carrier panel 510 prior to placing the subpanels 514a, 514b, 514c, and 514d on the carrier panel 510, in alternative examples, adhesive material may be individually formed on the back sides of the subpanels 514a-514d instead of (or in addition to) forming adhesive material on the carrier panel 510.

In the example shown in FIG. 5, after the adhesive material 512 is formed on the carrier panel 510, the subpanels 514a, 514b, 514c, and 514d are placed or pressed on the adhesive material 512, thus adhering the subpanels 514a, 514b, 514c, and 514d to the carrier panel 510. Note that a vacuum lamination or clamping process (or other force providing process) may be utilized to mount the subpanels 514a, 514b, 514c, and 514d to the adhesive 512 and carrier panel 510.

The subpanels 514a, 514b, 514c, and 514d may, for example, be placed face-up (e.g., such that front (or active) sides of the subpanel dies 214a-214d are facing upward, such that interconnection structures of the subpanel dies are facing upward, etc.). In general, for example, a side of the subpanel on which further processing is to be performed (e.g., whether a front side or an active side, or a back side or inactive side, or any side) is positioned to be facing upward from the carrier panel 510.

In this example, the top side of the carrier panel 510 is entirely planar. Note, however, that this is not required. For example, as shown in other examples presented herein, the carrier panel 510 may comprise apertures in or over which the subpanels 514a, 514b, 514c, and 514d are placed. Such apertures may, for example, extend completely through the carrier panel 510. Also for example, the carrier panel 510 may comprise cavities (e.g., registration indentations, etc.) in or over which the subpanels 514a, 514b, 514c, and 514d are placed. Such cavities may, for example, extend entirely through the carrier panel 510 or only partially through the carrier panel 510.

Figure 6:
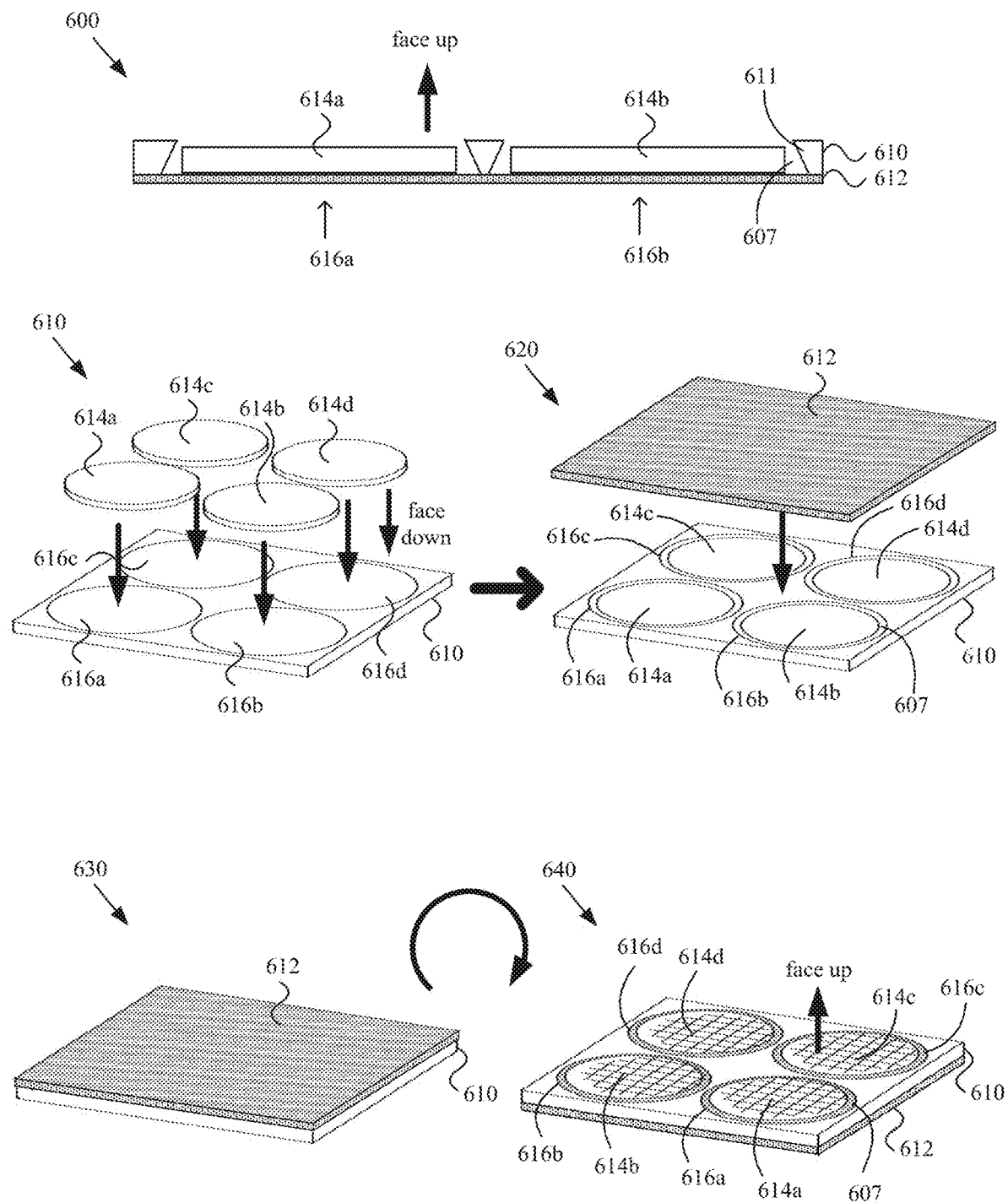
FIG. 6 shows a second example method of mounting subpanels to a panel, and example electronic devices produced thereby.

Turning next to FIG. 6, such figure shows a second example method of mounting subpanels to a panel, and example electronic devices produced thereby. In some implementations, such subpanels can comprise or correspond to other subpanels disclosed herein, such as the subpanels of FIGS. 2-3 comprising dies 214a-214d, such as the subpanels 415, 425, 435, 445, 455, and 465 of FIG. 4, etc. FIG. 6 shows a vertical cross-sectional view 600 and perspective views 610, 620, 630, and 640 of the second example method.

The example carrier panel 610 is provided. As discussed herein, the carrier panel 610 may comprise any of a variety of materials. For example, the carrier panel 610 may comprise metal (e.g., stainless steel, etc.), glass, ceramic, etc. In an example implementation, the carrier panel 610 may comprise a metal or other conductive material through which thermal energy may readily pass to a thermal-releasable adhesive (e.g., metal or other material having a high thermal conductance). In another example implementation, the carrier panel 610 (or any carrier panel discussed herein) may comprise a panel (e.g., a glass panel, etc.) that has a same or substantially the same (e.g., within 5%, within 10%, etc.) coefficient of thermal expansion (CTE) as the subpanels to be mounted to the carrier panel 610. Also for example, the example carrier panel 610 (or any example carrier panel discussed herein) may be formed of a material that has a CTE within 25% or 50% of the CTEs of the subpanels to be mounted to the carrier panel 610.

The example carrier 610 comprises apertures 616a, 616b, 616c, and 616d in which the subpanels 614a, 614b, 614c, and 614d are mounted. The apertures 616a, 616b, 616c, and 616d may, for example, be bounded by sidewalls 611 in the carrier panel 610. Such sidewalls 611 (or for example a bottom portion thereof) may, for example, be beveled to assist with placement of the subpanels 614a, 614b, 614c, and 614d in the apertures 616a, 616b, 616c, and 616d. The sidewalls 611 may also, for example, be vertical (e.g., as shown by the sidewalls 711 of FIG. 7A).

As shown at example views 610 and 620, the subpanels 614a, 614b, 614c, and 614d are positioned face-down in the apertures 616a, 616b, 616c, and 616d, respectively. For example, the front sides of the subpanels 614a, 614b, 614c, and 614d to be processed at block 150 may be placed face-down (e.g., so that the front sides of dies 214a-214d are also face-down). In other words, in the views 610 and 620, the subpanels 614a, 614b, 614c, and 614d and the carrier panel 610 are facing bottom-side-up. Note that the back sides of the subpanels 614a, 614b, 614c, and 614d may alternatively be positioned face-down, for example in scenarios in which back side processing is to be performed.

As shown in view 600, there is a gap 607 in the aperture 616b (or any or all apertures) between the sidewall 611 of the aperture 616b and the subpanel 614b. This gap 607 may, for example, be any size needed for reliable processing. For example, the gap 607 may be sized to account for a maximum subpanel size within a specified tolerance and a minimum subpanel aperture within a specified tolerance, considering placement machine capabilities, etc.

Also, as shown in view 600, the thicknesses of the subpanels 614a, 614b, 614c, and 614d and the carrier panel 610 are such that the front sides of the subpanels 614a, 614b, 614c, and 614d are vertically below the top of the carrier panel 610. The scope of this disclosure, however, is not limited to such dimensions. For example, the subpanels 614a, 614b, 614c, and 614d or the carrier panel 610 may be sized such that the front sides of the subpanels 614a, 614b, 614c, and 614d and the top side of the carrier panel 610 are coplanar or substantially coplanar (e.g., within a 5% height deviation from a reference plane at the bottom of the carrier panel 610, within a 10% height deviation from a reference plane at the bottom of the carrier panel 610, etc.). Such a configuration may, for example, enhance the quality of further processing, for example in applying consistent dielectric or conductive layers, etc. In another example configuration, the subpanels 614a, 614b, 614c, and 614d or the carrier panel 610 may be sized such that the front sides of the subpanels 614a, 614b, 614c, and 614d are vertically higher than the top side of the carrier panel 610. Such a configuration may, for example, eliminate the carrier panel 610 as an obstruction in further processing.

As shown at view 620, an adhesive material 612 (e.g., an adhesive layer 612) is formed on the carrier panel 610 and on the subpanels 614a, 614b, 614c, and 614d, for example on the back side thereof. As discussed herein, the adhesive material 612 may comprise any of a variety of characteristics. For example, the adhesive material 612 may comprise a light-releasable adhesive, a thermal-releasable adhesive, a die-attach adhesive, a curable bonding agent, etc. As discussed herein, although the adhesive material 612 is shown covering an entire back side of the carrier panel 610, such coverage is not required. For example, a perimeter region on the back side of the carrier panel 610, or at one or more horizontal ends of the back side of the carrier panel 610, may remain free of the adhesive material 612 (e.g., for handling, for securing, for aligning, etc.).

The adhesive material 612 may be formed in any of a variety of manners (e.g., rolling on, printing, spraying, applying or laminating a preformed adhesive tape or film, spin-coating, dipping, vapor-depositing, etc.). In an example implementation, a preformed adhesive sheet 612 (or tape or film) may be rolled on the back side of the carrier panel 610 and on the back sides of the subpanels 614a, 614b, 614c, and 614d. The adhesive 612 (e.g., an adhesive sheet, tape, or film, etc.) may be vacuum laminated (or vacuum clamped) on the back sides of the carrier panel 610 and subpanels 614a, 614b, 614c, and 614d.

As shown in the views 630 and 640, after the forming of the adhesive material 612, the structure may be inverted (or flipped) so that the front sides of the carrier panel 610 and of the subpanels 614a, 614b, 614c, and 614d are facing upward (or face-up) for further processing (e.g., at block 150, etc.).

Although the example mounting shown in FIG. 6 forms the adhesive material 612 on the carrier panel 610 and subpanels 614a, 614b, 614c, and 614d (e.g., on the back sides thereof) after placing the subpanels 614a, 614b, 614c, and 614d in the apertures 616a, 616b, 616c, and 616d, the adhesive material 612 (e.g., an adhesive sheet, tape, or film, etc.) may be coupled to the back side of the carrier panel 610 prior to the placement of the subpanels 614a, 614b, 614c, and 614d in the apertures 616a, 616b, 616c, and 616d, for example such that the back sides of the subpanels 614a, 614b, 614c, and 614d are adhered to the adhesive 612 during or after such placement (e.g., by mechanical pressing, by vacuum laminating or clamping, etc.).

Figure 7A:
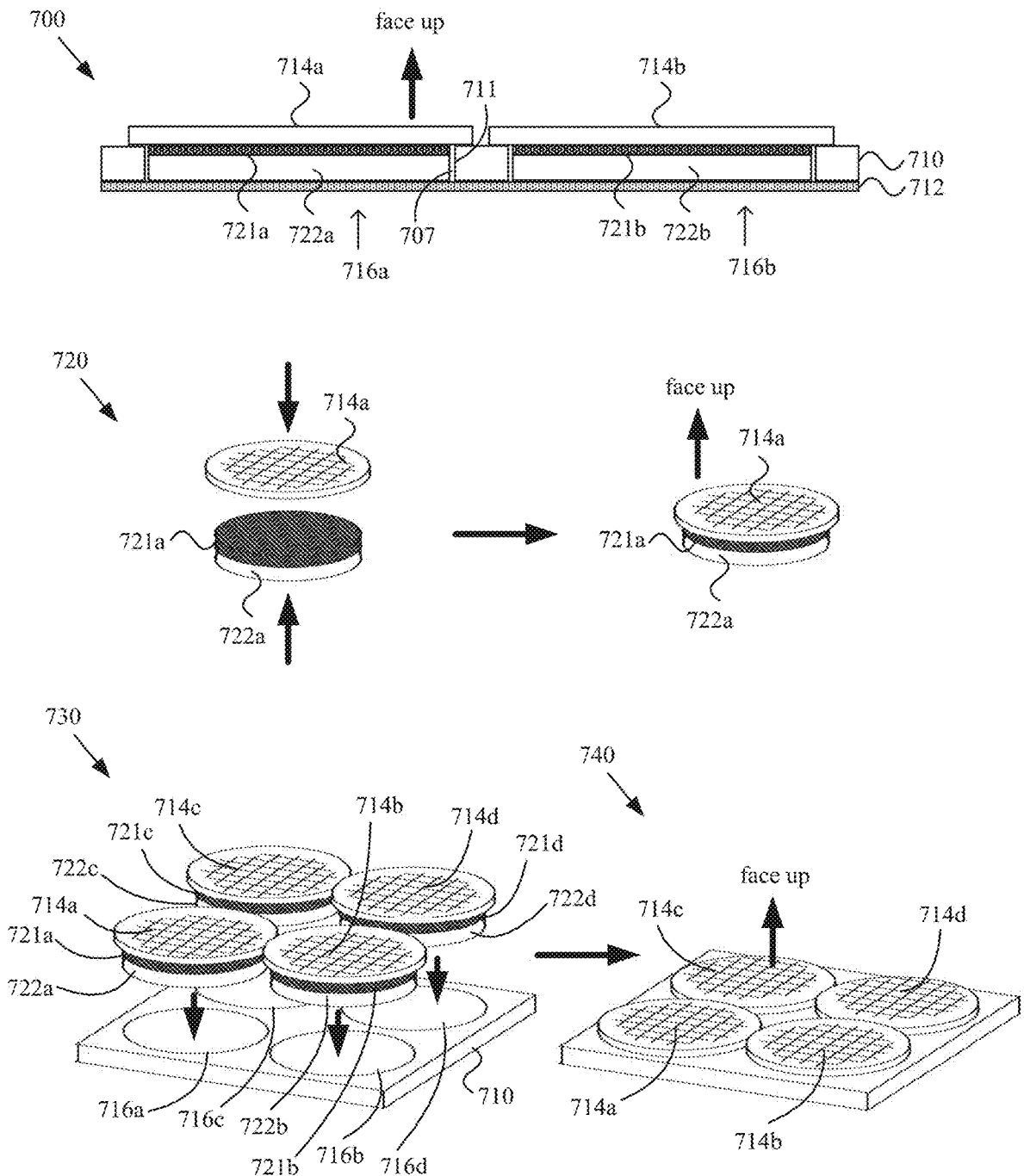
FIGS. 7A and 7B show a third example method of mounting subpanels to a panel, and example electronic devices produced thereby.
Figure 7B:
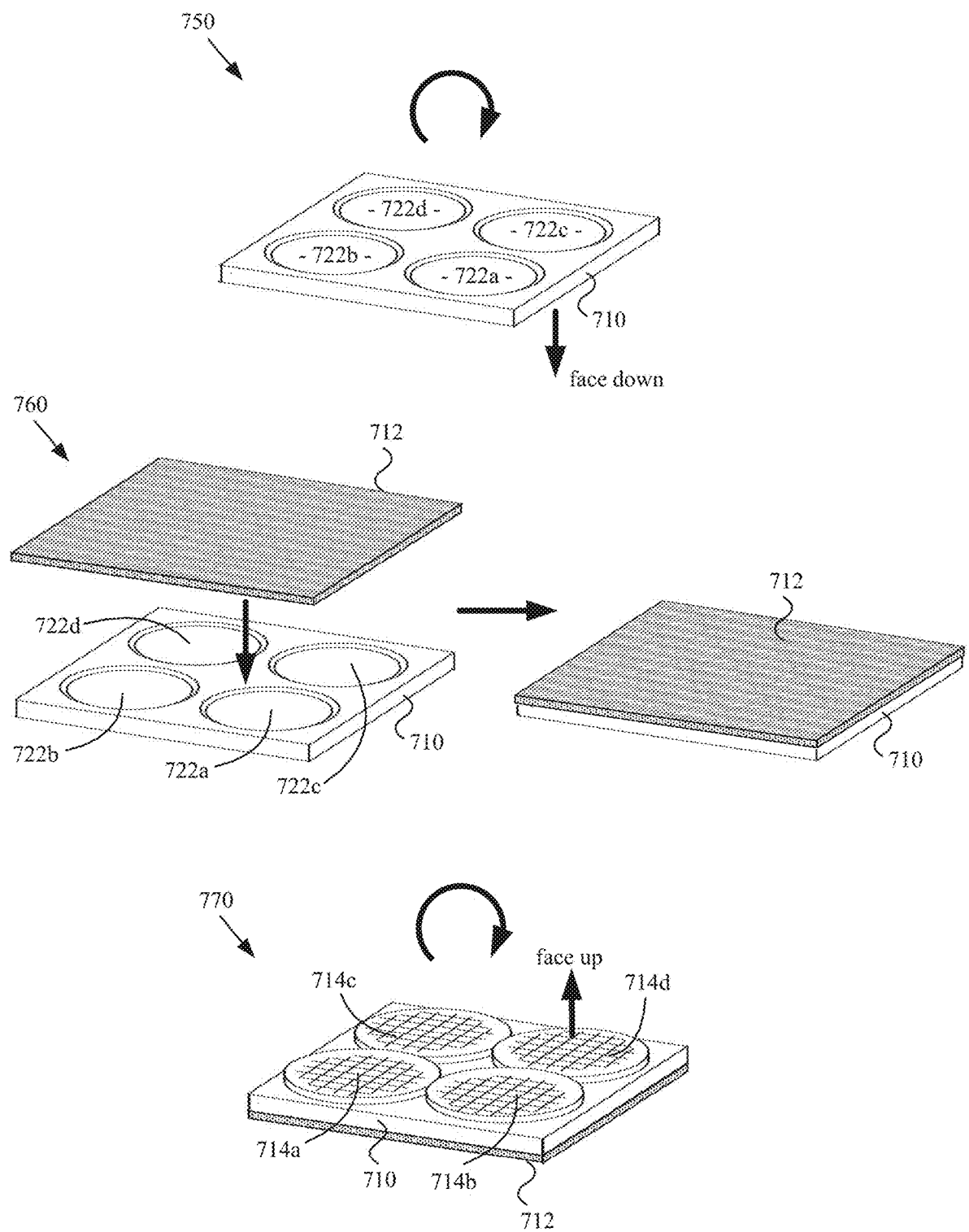

Turning next to FIGS. 7A and 7B, such figures show a third example method of mounting subpanels to a panel, and example electronic devices produced thereby. In some implementations, such subpanels can comprise or correspond to other subpanels disclosed herein, such as the subpanels of FIGS. 2-3 comprising dies 214a-214d, such as the subpanels 415, 425, 435, 445, 455, and 465 of FIG. 4, etc. FIGS. 7A and 7B show a vertical cross-sectional view 700 and perspective views 720, 730, 740, 750, 760, and 770 of the third example method 700.

The example carrier panel 710 is provided. As discussed herein, the carrier panel 710 may comprise any of a variety of materials. For example, the carrier panel 710 may comprise metal (e.g., stainless steel, etc.), glass, ceramic, etc. In an example implementation, the carrier panel 710 may comprise a metal or other conductive material through which thermal energy may readily pass to a thermal-releasable adhesive (e.g., metal or other material with a high thermal conductance). In another example implementation, the carrier panel 710 (or any carrier panel discussed herein) may comprise a panel (e.g., a glass panel, etc.) that has a same or substantially the same (e.g., within 5%, within 10%, etc.) coefficient of thermal expansion (CTE) as the subpanels to be mounted to the carrier panel 710. Also for example, the example carrier panel 710 (or any example carrier panel discussed herein) may be formed of a material that has a CTE within 25% or 50% of the CTEs of the subpanels to be mounted to the carrier panel 710.

The example carrier 710 comprises apertures 716a, 716b, 716c, and 716d in which inserts 722a, 722b, 722c, and 722d are inserted (e.g., where the subpanels 714a, 714b, 714c, and 714d are mounted to the inserts 722a, 722b, 722c, and 722d). The apertures 716a, 716b, 716c, and 716d may, for example, be defined by sidewalls 711 in the carrier panel 710. Such sidewalls 711 (or for example a top portion thereof) may, for example, be beveled (e.g., as shown by the sidewalls 611 of FIG. 6, for example inverted) to assist with placement of the inserts 722a, 722b, 722c, and 722d in the apertures 716a, 716b, 716c, and 716d. The sidewalls 711 may also, for example, be vertical as shown at view 700.

In the example shown in FIGS. 7A and 7B, inserts 722a, 722b, 722c, and 722d are provided. The inserts 722a, 722b, 722c, and 722d may comprise any of a variety of characteristics. For example, the inserts 722a, 722b, 722c, and 722d may share any characteristics with any of the panels or subpanels discussed herein. For example, the inserts 722a, 722b, 722c, and 722d may comprise any of a variety of materials. For example, the inserts 722a, 722b, 722c, and 722d may be or comprise metal (e.g., stainless steel, etc.), glass, ceramic, etc. In an example implementation, the inserts 722a, 722b, 722c, and 722d may comprise a metal or other conductive material through which thermal energy may efficiently pass to a thermal-releasable adhesive (e.g., a metal or other material having a high thermal conductance). In another example implementation, the inserts 722a, 722b, 722c, and 722d may comprise glass through which light (e.g., UV radiation) may efficiently pass to a light-releasable adhesive thereon (e.g., a glass or other material having a high transmittance at the relevant wavelengths, above 80%, above 90%, etc.). Note that the inserts 722a, 722b, 722c, and 722d may be made of a material that is different from (or the same as) the material of which the carrier panel 710 is made.

As shown in FIG. 7A, the inserts 722a, 722b, 722c, and 722d may be sized to be laterally narrower than the subpanels 714a, 714b, 714c, and 714d. For example, as shown in the views 700 and 730, the insert 722a is laterally narrower than the aperture 716a (e.g., bounded by the sidewall 711 of the aperture 716a). The subpanel 714a, however, is laterally wider than the insert 722a and the aperture 716a, thus leaving a periphery of the back side of the subpanel 714a exposed from the insert 722a. Thus, while the insert 722a is positioned within the aperture 716a, the subpanel 714a sits atop the carrier panel 710, resting on a top surface of the carrier panel 710. Note, however, that in other example implementations, the inserts 722a, 722b, 722c, and 722d may be sized to be laterally the same size or substantially the same size (e.g., within 5%, within 10%, etc.) as the subpanels 714a, 714b, 714c, and 714d. In such a configuration, the inserts 722a, 722b, 722c, and 722d, the adhesive materials 721a, 721b, 721c, and 721d, and the subpanels 714a, 714b, 714c, and 714d may be entirely or partially positioned within the cavities 716a, 716b, 716c, and 716d. In an example configuration, front sides of the subpanels 714a, 714b, 714c, and 714d and the top side of the carrier panel 710 may be coplanar or substantially coplanar (e.g., within a 5% height deviation from a reference plane at a bottom side of the carrier panel 710, within a 10% height deviation from a reference plane at a bottom side of the carrier panel 710, etc.). In other words, the thicknesses of the subpanels 714a, 714b, 714c, and 714d, the thicknesses of the inserts 722a, 722b, 722c, and 722d, the thicknesses of the adhesive materials 721a, 721b, 721c, and 721d, and the thickness of the carrier panel 710 may be specified such that the top side of the carrier panel 710 may be coplanar or substantially coplanar with the front sides of the subpanels 714a, 714b, 714c, and 714d. Such a configuration may, for example, enhance the quality of further processing, for example in applying or maintaining consistent dielectric or conductive layers, etc. In another example configuration, such components may be sized such that the front sides of the subpanels 714a, 714b, 714c, and 714d are vertically higher than the top side of the carrier panel 710. Such a configuration may, for example, eliminate the carrier panel 710 as an obstruction in further processing. In another example configuration, such components may be sized such that the front sides of the subpanels 714a, 714b, 714c, and 714d are vertically lower than the top side of the carrier panel 710. Such a configuration may, for example, provide environmental protection for the subpanels 714a, 714b, 714c, and 714d during processing.

As shown in FIG. 7A, in particular at view 720, the subpanel 714a is mounted to a respective insert 722a with an adhesive material 721a (e.g., an adhesive layer 721a). The subpanel 714a is mounted in a face-up (or front-side-up) configuration in which the front side of the subpanel 714a to be processed (e.g., a side comprising active circuitry, a side comprising interconnection structures, etc.) is facing upward away from the respective insert 722a. Note that as explained elsewhere herein, a back-side-up configuration may be used when back-side processing is to be performed. Each of the subpanels 714a, 714b, 714c, and 714d is thus mounted to a respective insert 722a, 722b, 722c, and 722d with a respective adhesive material 721a, 721b, 721c, and 721d. In some implementations, such subpanels 714a-714d can comprise or correspond to other subpanels disclosed herein, such as the subpanels of FIGS. 2-3 comprising dies 214a-214d, such as the subpanels 415, 425, 435, 445, 455, and 465 of FIG. 4, etc.

As shown in view 730, each of the inserts 722a, 722b, 722c, and 722d and adhesives 721a, 721b, 721c, and 721d is inserted in a respective aperture 716a, 716b, 716c, and 716d in the carrier panel 710. The resulting structure from such insertion is shown, for example, at view 740 and at view 700.

After such insertion of the inserts 722a, 722b, 722c, and 722d, and as shown in view 750, the structure is inverted so that the bottom side of the carrier panel 710 and back sides of the inserts 722a, 722b, 722c, and 722d are facing upward. Then (e.g., as discussed previously with regard to the view 620 of FIG. 6) as shown at FIG. 7B view 760, an adhesive material 712 (e.g., an adhesive layer 712) is formed on the carrier panel 710 and on the inserts 722a, 722b, 722c, and 722d, for example on bottom sides thereof. As discussed herein, the adhesive material 712 may comprise any of a variety of characteristics. For example, the adhesive material 712 may comprise a light-releasable adhesive, a thermal-releasable adhesive, a die-attach adhesive, a curable bonding agent, etc. As discussed herein, although the adhesive material 712 is shown covering an entire bottom side of the carrier panel 710, such coverage is not required. For example, a perimeter region on the bottom side of the carrier panel 710, or at one or more horizontal ends of the bottom side of the carrier panel 710, may remain free of the adhesive material 712 (e.g., for handling, for securing, for aligning, etc.).

As shown in the view 770, after the forming of the adhesive material 712, the structure may be inverted (or flipped) so that the top sides of the carrier panel 710 and front sides of subpanels 714a, 714b, 714c, and 714d (or back sides if desired) are facing upward (face-up) for further processing (e.g., at block 150, etc.). At this point, the vertical cross-sectional view 700 and the perspective view 770 illustrate different views of the same structure.

Although the example mounting shown in FIG. 7 forms the adhesive material 712 on the carrier panel 710 and inserts 722a, 722b, 722c, and 722d (e.g., on the bottom sides thereof) after placing the inserts 722a, 722b, 722c, and 722d in the apertures 716a, 716b, 716c, and 716d, the adhesive material 712 (e.g., an adhesive sheet, tape, or film, etc.) may be coupled to the underside of the carrier panel 710 prior to the placement of the inserts 722a, 722b, 722c, and 722d in the apertures 716a, 716b, 716c, and 716d, for example such that the bottom sides of the inserts 722a, 722b, 722c, and 722d are adhered to the adhesive 712 during or after such placement (e.g., by mechanical pressing, by vacuum laminating or clamping, etc.).

As shown in views 700 and 730, there is a gap 707 in the aperture 716a (or any or all apertures) between the sidewall 711 of the aperture 716a and the insert 722a. This gap 707 may, for example, be any size needed for reliable processing. For example, the gap 607 may be sized to account for a maximum insert size within a specified tolerance and a minimum subpanel aperture within a specified tolerance, considering placement machine capabilities, etc.

Although the example mounting shown in FIGS. 7A and 7B forms the adhesive material 712 on the carrier panel 710 and inserts 722a, 722b, 722c, and 722d (e.g., on the bottom sides thereof) after placing the inserts 722a, 722b, 722c, and 722d in the apertures 716a, 716b, 716c, and 716d, the adhesive material 712 (e.g., an adhesive sheet, tape, or film, etc.) may be coupled to the underside of the carrier panel 710 prior to the placement of the inserts 722a, 722b, 722c, and 722d in the apertures 716a, 716b, 716c, and 716d, for example such that the bottom sides of the inserts 722a, 722b, 722c, and 722d are adhered to the adhesive 712 during or after such placement (e.g., by mechanical pressing, by vacuum laminating, etc.).

Figure 8:
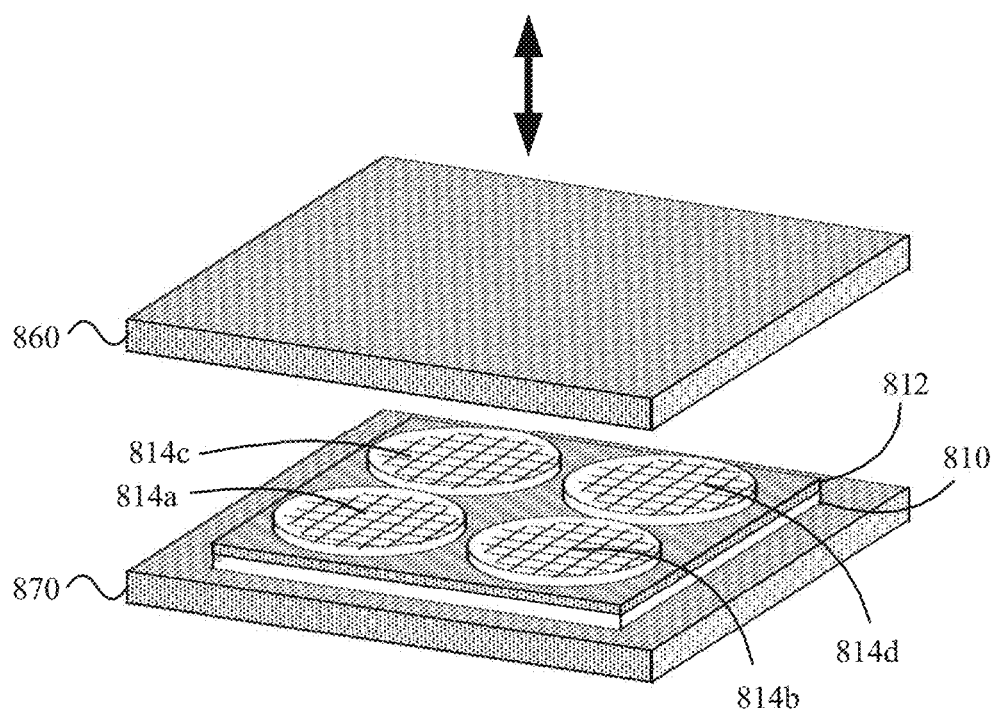
FIG. 8 shows an example method of (and apparatus for) vacuum-laminating subpanels to a panel, and example electronic devices produced thereby.

As mentioned throughout this disclosure, a vacuum laminating (or clamping or pressing) process may be utilized to perform various mountings or couplings discussed herein. An example illustration 800 of a vacuum laminating process and fixture is shown at FIG. 8. For example, an example structure comprising a carrier panel 810 with subpanels 814a, 814b, 814c, and 814d coupled to the carrier panel 810 with an adhesive material 812 is placed on a lower vacuum chuck 870. In some implementations, such subpanels 814a-814d can comprise or correspond to other subpanels disclosed herein, such as the subpanels of FIGS. 2-3 comprising dies 214a-214d, such as the subpanels 415, 425, 435, 445, 455, and 465 of FIG. 4, etc. An upper vacuum chuck 860 is then lowered to hermetically seal the apparatus. Vacuum can then be generated in the chamber to clamp or press (e.g., simultaneously clamp or press) the subpanels 814a, 814b, 814c, and 814d on the adhesive material 812, and to further press the adhesive material 812 on the carrier panel 810. In one example configuration, air is injected into (or allowed to flow into) a diaphragm, and the expansion of the diaphragm presses the subpanels 814a-814d against the adhesive material 812 or the carrier panel 810. Such vacuum laminating (or other bonding processes discussed herein) may also, for example, be performed at an elevated temperature to enhance the laminating process (e.g., to increase bonding quality, to decrease manufacturing time, etc.). For example, such vacuum laminating (or other bonding processes discussed herein) may be performed at 180 degrees Celsius, at a temperature in a range from 100 degrees Celsius to 200 degrees Celsius, etc.

In an additional example implementation, block 140 may comprise mechanically clamping the subpanels to the carrier panel. For example, such mechanically clamping may comprise utilizing clips, magnets (e.g., permanent magnets, etc.). Vacuum clamping may also, for example, be utilized.

Returning to FIG. 1, the example method 100 may, at block 150, comprise performing one or more processing steps on the structure comprising the carrier panel and subpanel(s) mounted thereto. Note that such a configuration may also be referred to herein as a "hybrid panel" or a "panel of subpanels."

Block 150 may comprise any of a variety of different types of processing. For example, block 150 may comprise performing any number of: cleaning, coating, encapsulating, masking, performing lithography, etching, stripping, developing, curing, dielectric layer forming, conductive layer forming, interconnection structure forming, 3D connection structure forming, device stacking, soldering or other attaching, redistribution structure (or layer) forming, device singulating, cutting, heat applying, light applying, baking, testing, shield forming, cover mounting, generally performing packaging steps, etc. Any or all of such different types of processing (or portions thereof) may be performed on the subpanels simultaneously. Note that such simultaneity is not required. For example, various types of processing of the subpanels may be performed on each subpanel sequentially depending on manufacturing capabilities and on the nature of the process. For example, a first processing operation may be performed on the subpanels simultaneously, and a second processing operation may be performed on the subpanels sequentially.

FIGS. 9A-9E show an example method that may be performed at block 150. More specifically, FIGS. 9A-9E show an example method of processing a hybrid panel (or hybrid panel), for example comprising forming a signal redistribution structure (RDS), and example electronic devices produced thereby. In some implementations, such subpanels can comprise or correspond to the subpanels of FIGS. 2-3, the subpanels 415, 425, 435, 445, 455, and 465 of FIG. 4, or other subpanels disclosed herein, and the dies of such subpanels can comprise or correspond to the dies 214a-214d of FIGS. 2-3.

Figure 9A:
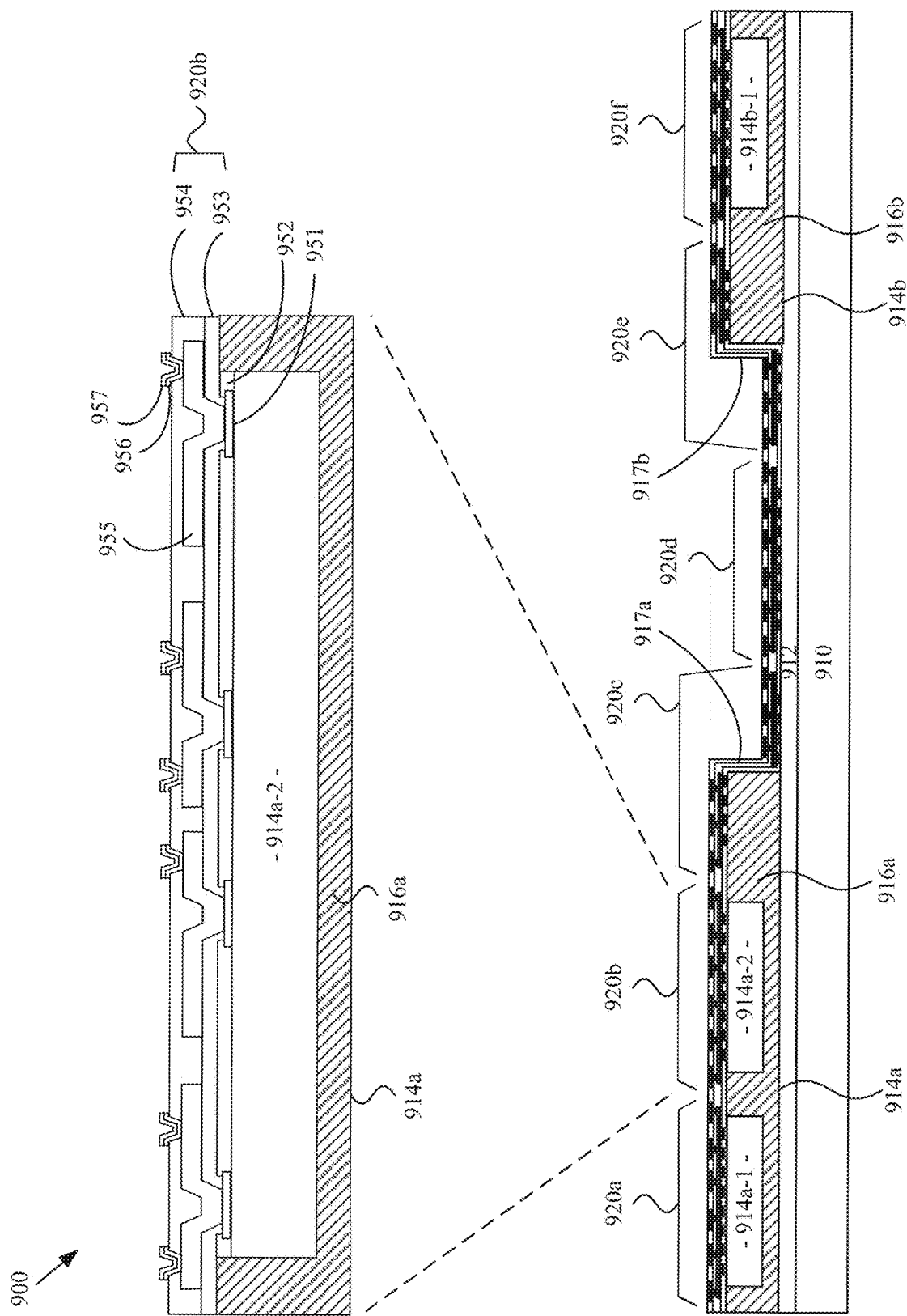
Figure 9B:
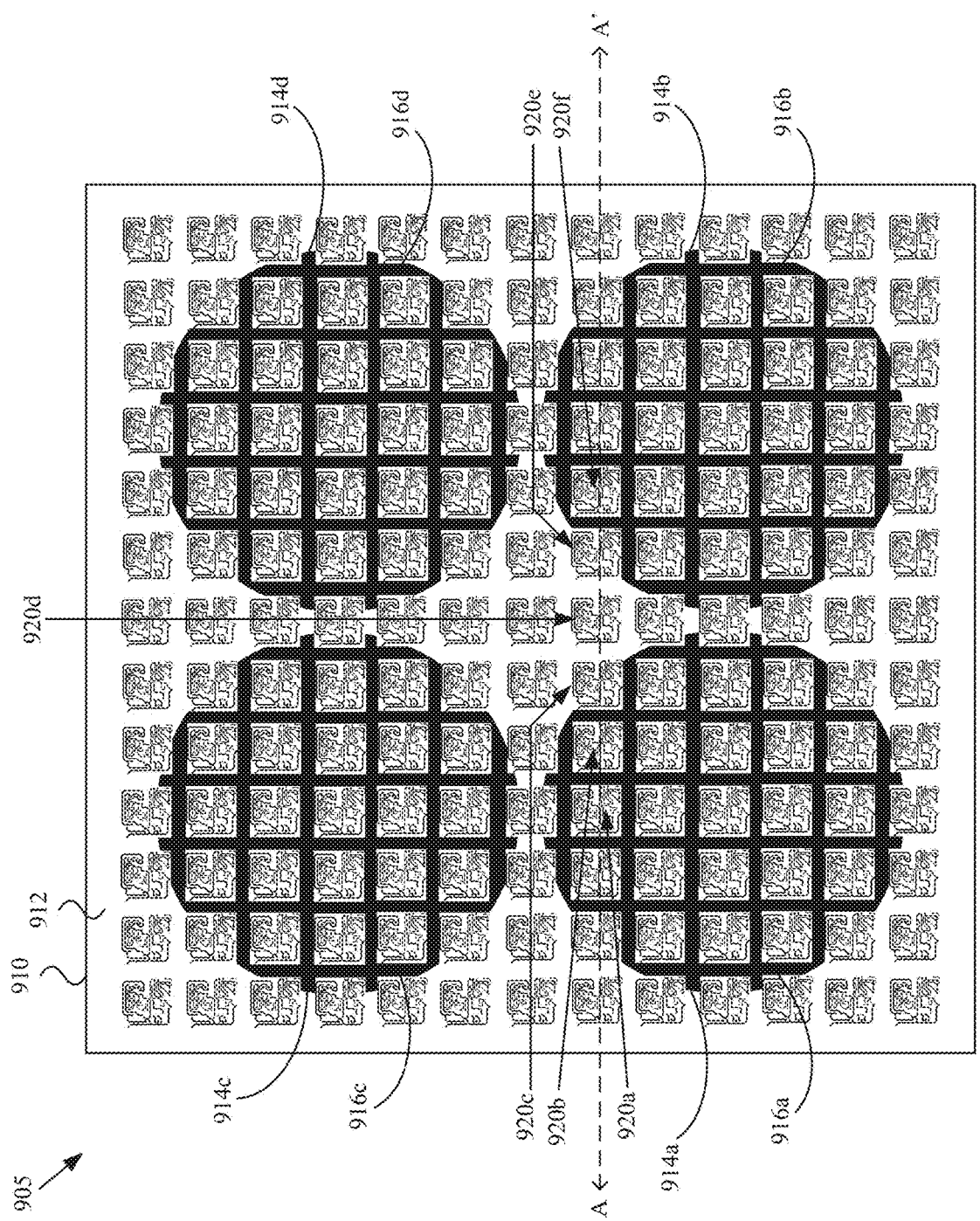
Figure 9C:
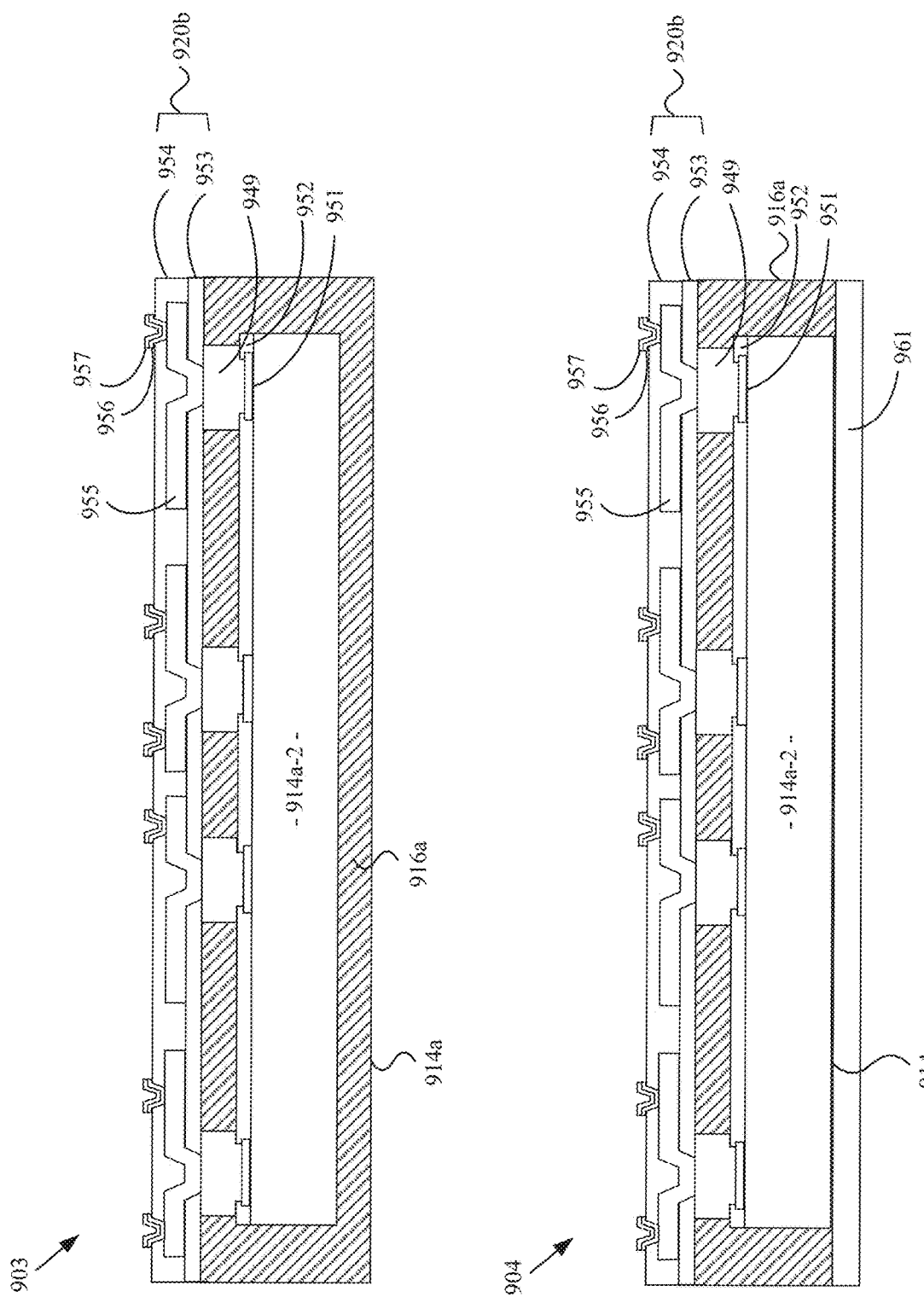

FIG. 9A shows a vertical cross-sectional view (along line A-A' of FIG. 9B), and FIG. 9B shows a top view illustrating the forming of signal redistribution structures (RDSs) (or signal distribution structures (SDSs)) on the hybrid panel. FIG. 9C shows alternative vertical cross-sectional views (along line A-A' of FIG. 9B. The forming of the signal redistribution structures may, for example, share any or all characteristics with U.S. patent application Ser. No. 16/534,814, filed Aug. 7, 2019, and titled "Semiconductor Device and Method of Manufacturing a Semiconductor Device"; U.S. patent application Ser. No. 16/260,674, filed Jan. 29, 2019, and titled "Semiconductor Package and Fabricating Method Thereof"; and U.S. patent application Ser. No. 17/028,621, filed Sep. 22, 2020, and titled "Semiconductor Package and Fabricating Method Thereof"; the entire contents of each of which are hereby incorporated herein by reference for all purposes. For example, such references provide numerous examples of types of processing steps that may be performed at block 150.

As shown in the example 900 of FIG. 9A, a portion of a first subpanel 914a and a portion of a second subpanel 914b are shown mounted to a carrier panel 910 with an adhesive material 912. The portion of the first subpanel 914a shown in FIG. 9A comprises a first semiconductor die 914a-1 and a second semiconductor die 914a-2 surrounded by a first encapsulating material 916a (e.g., in a reconstituted wafer or subpanel configuration). The portion of the second subpanel 914b shown in FIG. 9A comprises a first semiconductor die 914b-1 surrounded by a second encapsulating material 916b (e.g., in a reconstituted wafer or subpanel configuration). In some implementations, the subpanels 914a-914d of FIGS. 9A-9D can comprise or correspond to other subpanels disclosed herein, such as the subpanels of FIGS. 2-3 comprising dies 214a-214d, such as the subpanels 415, 425, 435, 445, 455, and 465 of FIG. 4, etc.

At block 150, a signal redistribution structure (RDS) 920b is formed over the semiconductor die 914a-2. A magnified view of the RDS 920b is provided at FIG. 9A. As shown, the semiconductor die 914a-2 has a plurality of terminals 951 (e.g., die pads, conductive bumps, conductive posts or pillars, etc.) that are exposed on the front side of the die 914a-2. In some examples, terminals 951 can protrude from the front side of die 914a-2 farther than the dielectric layer 952 (e.g., a die passivation layer). In such examples, the encapsulating material 916a can also extend over the front side of the die 914a-2, or can contact lateral sides of such protruded terminals 951 (e.g., as shown at FIG. 9C).

A first dielectric layer 953 is formed over the front side of die 914a-2 and on the encapsulating material 916a. Such forming may, for example, be shown at block 152. A first conductive layer 955 is formed on the first dielectric layer 953 and extends through an aperture (e.g., formed by etching or lithography, laser or mechanical ablation, etc.) in the first dielectric layer 953 to contact the terminal 951. Such forming may, for example, be shown at blocks 154 and 156 (e.g., forming a seed layer for electroplating, and then electroplating a conductive layer over the seed layer). A second dielectric layer 954 is formed on the first dielectric layer 953 and on the first conductive layer 955. A second conductive layer 956 is formed on the second dielectric layer 954 and extends through an aperture (e.g., formed by etching or lithography, laser or mechanical ablation, etc.) in the second dielectric layer 954 to contact the first conductive layer 953. A third conductive layer 957 is formed on the second conductive layer 956. The second conductive layer 956 and the third conductive layer 957 may, for example, be a multilayer under bump metallization (UBM) structure. In an example implementation, any or all of the blocks 152, 154, and 156 may be performed any number of times.

The dielectric layers 952, 953, and 954 may comprise one or more layers of any of a variety of dielectric materials, for example inorganic dielectric materials (e.g., $Si_3N_4$, $SiO_2$, SiON, SiN, oxides, nitrides, combinations thereof, equivalents thereof, etc.) or organic dielectric material (e.g., a polymer, polyimide (PI), benzocyclobutene (BCB), polybenzoxazole (PBO), bismaleimide triazine (BT), a molding material, a phenolic resin, an epoxy, silicone, acrylate polymer, combinations thereof, equivalents thereof, etc.), but the scope of the present disclosure is not limited thereto.

The dielectric layers 952, 953, and 954 may be formed using any one or more of a variety of processes (e.g., spin coating, spray coating, printing, sintering, thermal oxidation, physical vapor deposition (PVD), chemical vapor deposition (CVD), atomic layer deposition (ALD), low pressure chemical vapor deposition (LPCVD), plasma enhanced chemical vapor deposition (PECVD), plasma vapor deposition (PVD), sheet lamination, evaporating, etc.), but the scope of the present disclosure is not limited thereto.

The conductive layers 951, 955, 956, and 957 (e.g., traces, terminals, underbump metallizations, conductive vias, etc.) may comprise any of a variety of materials (e.g., copper, aluminum, nickel, iron, silver, gold, titanium, chromium, tungsten, palladium, combinations thereof, alloys thereof, equivalents thereof, etc.), but the scope of the present disclosure is not limited thereto.

The conductive layers 951, 955, 956, and 957 may be formed or deposited utilizing any one or more of a variety of processes (e.g., electrolytic plating, electroless plating, chemical vapor deposition (CVD), metal organic chemical vapor deposition (MOCVD), sputtering or physical vapor deposition (PVD), atomic layer deposition (ALD), plasma vapor deposition, printing, screen printing, lithography, etc.), but the scope of the present disclosure is not limited thereto.

In an example implementation, in the forming of a conductive layer, one or more electroplating seed layers may be formed over the entire carrier panel 910 and subpanels 914a, 914b (e.g., over the top sides of the subpanels, over the lateral sides of the subpanels, over the top side of the carrier panel between adjacent subpanels, etc.). The seed layer(s) may comprise any of a variety of materials. For example, the seed layer(s) may comprise copper. Also for example, the seed layer(s) may comprise one or more layers of any of a variety of metals (e.g., silver, gold, aluminum, tungsten, titanium, nickel, molybdenum, etc.). The seed layer(s) may be formed utilizing any of a variety of techniques (e.g., sputtering or other physical vapor deposition (PVD) technique, chemical vapor deposition (CVD), electroless plating, electrolytic plating, etc.). The seed layer(s) may, for example, be utilized during a subsequent electroplating process. After the forming of the seed layer(s), a conductive pattern may be formed over the seed layer (e.g., through a mask formed of a photoresist material) and a conductive pattern may then be electroplated on the parts of the seed layer(s) exposed through the mask.

One or more of the conductive layers 955, 956, and 957 may, for example, extend laterally outside the footprint of the semiconductor die 914a-2 in a Fan-Out configuration.

As shown in FIGS. 9A and 9B, redistribution structures 920a and 920f can be are identical to the redistribution structure 920b and can be formed over semiconductor dies 914a-1 and 914b-2, respectively. Note, however, that such redistribution structures need not be identical.

Also, as shown in FIGS. 9A and 9B, a redistribution structure 920d may be formed over the carrier panel 910, for example on the adhesive material 912 if present, and laterally between the first subpanel 914a and the second subpanel 914b. Such a redistribution structure 920d may, for example, be sacrificial, to be removed later and discarded or recycled. Such a redistribution structure 920d, although not ultimately used in an electronic package, may advantageously enhance the uniformity of the various conductive layers (e.g., conductive layers 955, 956, 957, etc.) and of the various dielectric layers (e.g., dielectric layers 953, 954, etc.) discussed herein, for example enhancing the uniformity of a plating or other deposition process across the entire carrier panel 910 or across the subpanels. Although in the example shown in FIGS. 9A and 9B, the configuration of the redistribution structure 920d may be the same as the redistribution structures 920a, 923b, and 920f, the redistribution structure 920d might be substantially the same (e.g., with 95% of the same configuration, with 90% of the same configuration, with 80% of the same configuration, etc.). In another example configuration, the redistribution structure 920d may be substantially different from the redistribution structures 920a, 920b, and 920f, but comprise layers having a same or substantially the same (e.g., within 5%, within 10%, within 20%, etc.) top surface area as the redistribution structures 920a, 920b, and 920f.

As also shown in FIGS. 9A and 9B, redistribution structures 920c and 920e may be formed partially over respective subpanels 914a and 914b, and partially over the carrier panel 910 between the subpanels 914a and 914b, for example on the adhesive material 912 if present. Such redistribution structures 920c and 920e may, for example, be sacrificial, for example to be removed later and discarded or recycled. Such redistribution structures 920c and 920e, although not ultimately used in an electronic package, may advantageously enhance the uniformity of the various conductive layers (e.g., conductive layers 955, 956, 957, etc.) and of the various dielectric layers (e.g., dielectric layers 953, 954, etc.) discussed herein, for example enhancing the uniformity of a plating or other deposition process across the entire carrier panel 910 or across the subpanels. Although in the example shown in FIG. 9A, the configuration of the redistribution structures 920c and 920e may be the same as the redistribution structures 920a, 923b, and 920f, the redistribution structures 920c and 920e might be substantially the same (e.g., with 95% of the same configuration, with 90% of the same configuration, with 80% of the same configuration, etc.). In another example configuration, the redistribution structures 920c and 920e may be substantially different from the redistribution structures 920a, 920b, and 920f, but comprise layers having a same or substantially the same (e.g., within 5%, within 10%, within 20%, etc.) top surface area as the redistribution structures 920a, 920b, and 920f.

As shown in FIG. 9A, redistribution structures 920c and 920e may (but not necessarily) have vertical regions 917a and 917b along the lateral sides of the subpanels 914a and 914b. In some examples, one or more dielectric layers (e.g., one or more of dielectric layers 953, 954, etc.) of the redistribution structures 920c and 920e may run vertically along the lateral sides of the subpanels 914a and 914b, and various conductive layers (e.g., one or more of conductive layers 955, 956, 957, etc.) might not run vertically along the lateral sides of the subpanels 914a and 914b. In some examples, any or all of such dielectric and conductive layers (e.g., seed layers, plated layers, etc.) might run vertically along the lateral sides of the subpanels 914a and 914b.

FIG. 9C provides additional examples 903 and 904 of vertical cross-sectional views (along A-A' of FIG. 9B). The examples 903 and 904 may, for example, share any or all characteristics discussed herein with regard to FIGS. 9A and 9B.

Turning to the example view 903, pillars (or posts) 949 may be formed on the terminals 951. Such pillars or posts may be formed utilizing any of a variety of techniques, non-limiting examples of which are provided in U.S. patent application Ser. No. 16/534,814, filed Aug. 7, 2019, and titled "Semiconductor Device and Method of Manufacturing a Semiconductor Device"; U.S. patent application Ser. No. 16/260,674, filed Jan. 29, 2019, and titled "Semiconductor Package and Fabricating Method Thereof"; and U.S. patent application Ser. No. 17/028,621, filed Sep. 22, 2020, and titled "Semiconductor Package and Fabricating Method Thereof"; the entire contents of each of which are hereby incorporated herein by reference for all purposes. Such pillars 949 may, for example, be formed at block 150, but may also have been formed as part of a reconstituted subpanel (e.g., at block 20 of FIG. 1) or received as part of a received subpanel (at block 10 of FIG. 1).

As shown in the example 903, the encapsulating material 916a (e.g., as received at block 10, as formed at block 27, etc.) may laterally surround and contact the pillars 949. For example, the top sides of the pillars 949 may be coplanar or substantially coplanar (e.g., within a 5% height deviation from a reference plane at the bottom of the reconstituted subpanel, within a 10% height deviation from a reference plane at the bottom of the reconstituted subpanel, etc.).

As shown in the example 904, the back side of the die 914a-2 may be exposed from the encapsulating material 916a. In additional, though not required, a structure 961 (e.g., an insulative structure, a conductive structure, etc.) may cover the back sides of the die 914a-2 and of the encapsulating material 916a. Such a structure 961 may, for example, be formed at block 150, but may also have been formed as part of a reconstituted subpanel (e.g., at block 20 of FIG. 1) or received as part of a received subpanel (at block 10 of FIG. 1).

As shown in the cross-sectional views of FIG. 9A, the lateral sides of the subpanels 914a and 914b may be vertical (e.g., relative to front and back sides). Note, however, that other configurations may be advantageous. For example, the relatively sharp 90 degree angles between the lateral sides and the front and back sides of the subpanels 914a and 914b may be reduced (or smoothed). Two examples of such angle reduction are provided at FIGS. 9D and 9E.

For example, FIGS. 9D and 9E show vertical cross-sectional views of example subpanels. As shown in the example subpanel 906 of FIG. 9D, a lateral edge of the subpanel 906 (e.g., any of the subpanels discussed herein) may comprise an upper chamfer 917 (e.g., extending around the perimeter of the front side of the subpanel 906). Note that in the example subpanel 906, a lower chamfer similar to the upper 917 may be formed (e.g., extending around the perimeter of the bottom side of the subpanel 906 and undercutting the bottom side of the subpanel 906). Note that such chamfers may also remove unwanted material from the subpanels, for example mold flashing, spurs, etc.

Also for example, as shown in the example 907 of FIG. 9E a lateral edge of the subpanel 907 (e.g., any of the subpanels discussed herein) may comprise a lower chamfer 918 (e.g., extending around the perimeter of the bottom side of the subpanel 907).

Such chamfers 917 or 918 may, for example, advantageously enhance the reliability of dielectric or conductive layers (e.g., seed layers, plated metal layers, etc.), for example the illustrated layers 921 and 922 (or any of the layers disclosed herein), running over the front sides of the subpanels 906 and 907, along the lateral sides of the subpanels 906 and 907, and over the adhesive material 912 between subpanels 906 and 907, may be more reliable. For example, the continuity of the layers 921 and 922 may be maintained, even under thermal stress and movement of the subpanels 906 and 907 due to CTE mismatch during processing. For example, in an example implementation in which the layer 921 is a dielectric layer (e.g., a sprayed layer of polyimide or any of the dielectric materials discussed herein) and the layer 922 is a seed layer for an electroplating process, the chamfers 917 or 918 may enhance the reliability and integrity of such a seed layer during thermal expansion and contraction experienced during processing (e.g., during plating, masking, etching, stripping, etc.). Note that the chamfers 917 or 918 may, for example be formed during the forming of the reconstituted subpanels (e.g., at block 20, as part of or after block 27, etc.). Additionally for example, in a scenario in which a semiconductor wafer is received at block 10, chamfers may be formed at this point to smooth the edges of the semiconductor wafer.

Note that the examples shown in FIGS. 9A-9E apply equally as well to semiconductor wafer subpanels and reconstituted subpanels (e.g., wafer-shaped or circular reconstituted subpanels, rectangular-shaped reconstituted subpanels, etc.). For example, the encapsulating material 916 or 916a-916d of FIGS. 9A-9E (and all encapsulating material of this disclosure) may be replaced with bulk semiconductor material of a semiconductor wafer.

Additionally, any of the example redistribution structures (RDSs) shown herein may be eliminated without departing from the spirit of this disclosure. For example, any one or more of the sacrificial redistribution structures (e.g., like the redistribution structure 920d) that are entirely laterally between the subpanels 914a, 914b, 914c, and 914c may be wholly or partially eliminated. Also for example, any one or more of the sacrificial redistribution structures (e.g., like the redistribution structures 920c and 920e) that are partially on (or over) the subpanels 914a, 914b, 914c, and 914d, and partially on (or over) the carrier panel 910 between the subpanels 914a, 914b, 914c, and 914d may be wholly or partially eliminated.

Any or all aspects of the example process 150 shown in FIGS. 9A-9E may be applied to any or all of the hybrid panel (or hybrid panel) configurations discussed herein (e.g., to the example configurations 410, 420, 430, 440, 450, and 460 shown in FIG. 4; to the example hybrid panel configuration formed at FIG. 5; to the example hybrid panel configuration formed at FIG. 6; to the example hybrid panel configuration formed at FIGS. 7A and 7B, etc.

Note that although the example processing illustrated in FIGS. 9A-9E is performed on the front sides of the subpanels or dies, the scope of this disclosure is not limited to only front-side processing, for example any of the processing may be performed on the back sides of the subpanels or dies instead of or in addition to being performed on the front sides. For example, in some example implementations, signal redistribution structures (e.g., like RDS 920) may be formed over front sides and back sides of the subpanels or dies, and conductive via structures (e.g., through encapsulating material 916) may be formed to electrically connect such front side RDSs and back side RDSs to each other.

Figure 10A:
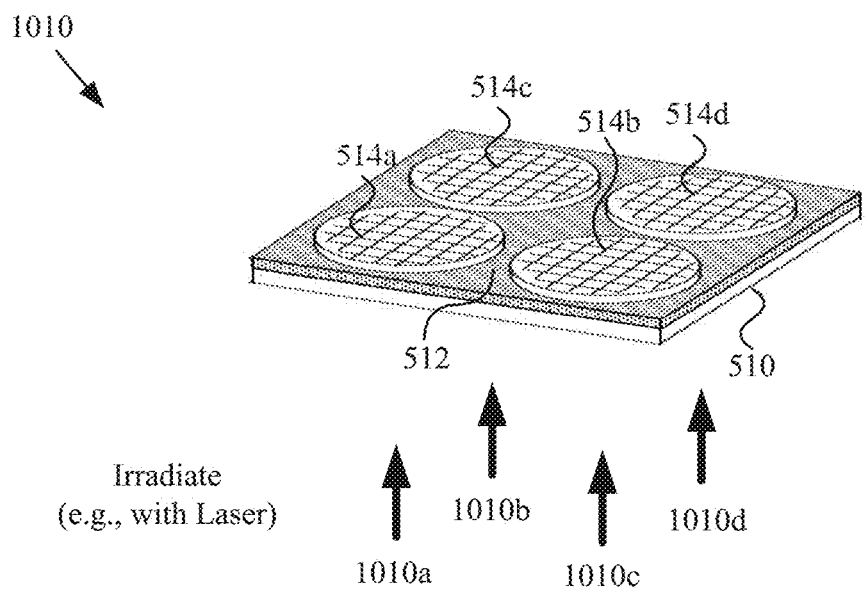
FIGS. 10A-10C show example methods of removing subpanels from a panel, and example electronic devices produced thereby.
Figure 10A:
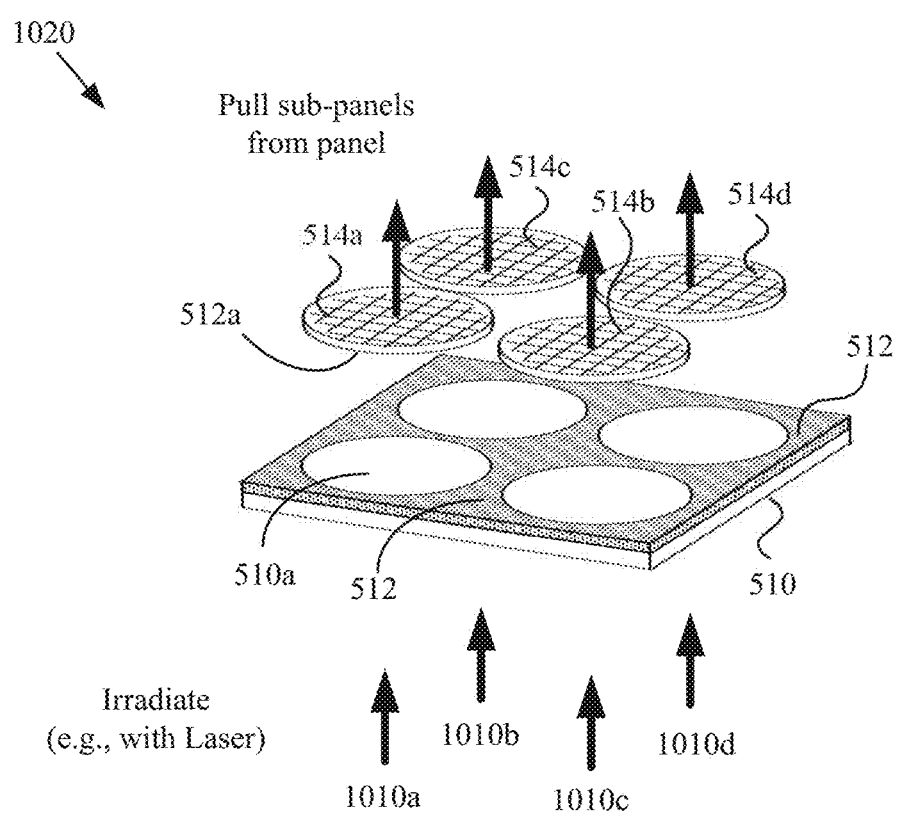
Figure 10B:
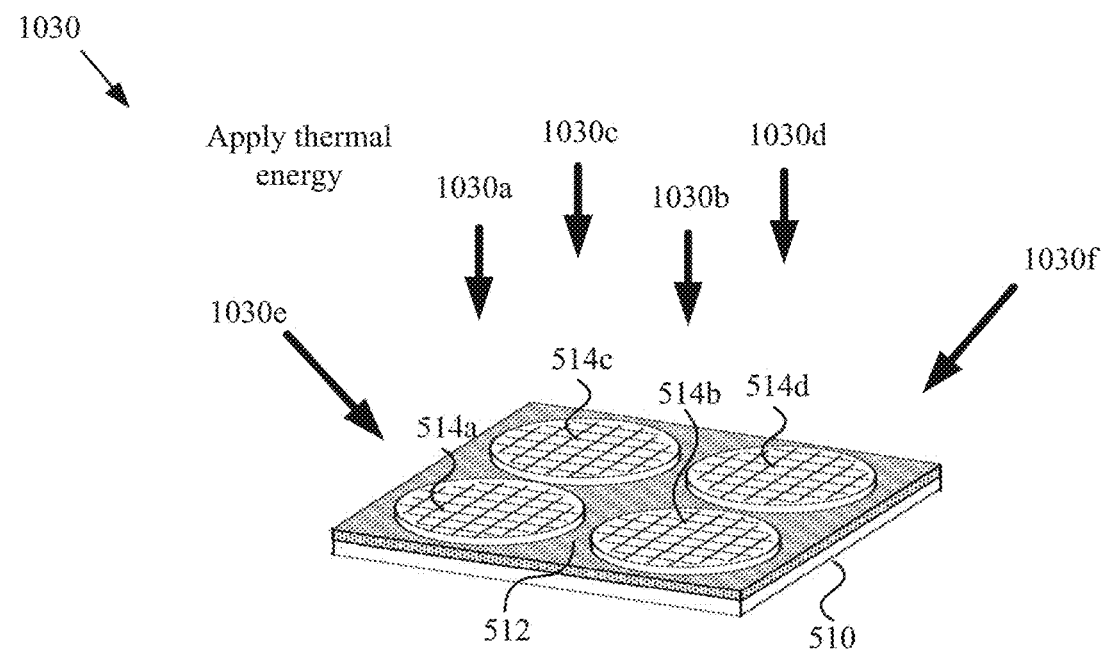
Figure 10B:
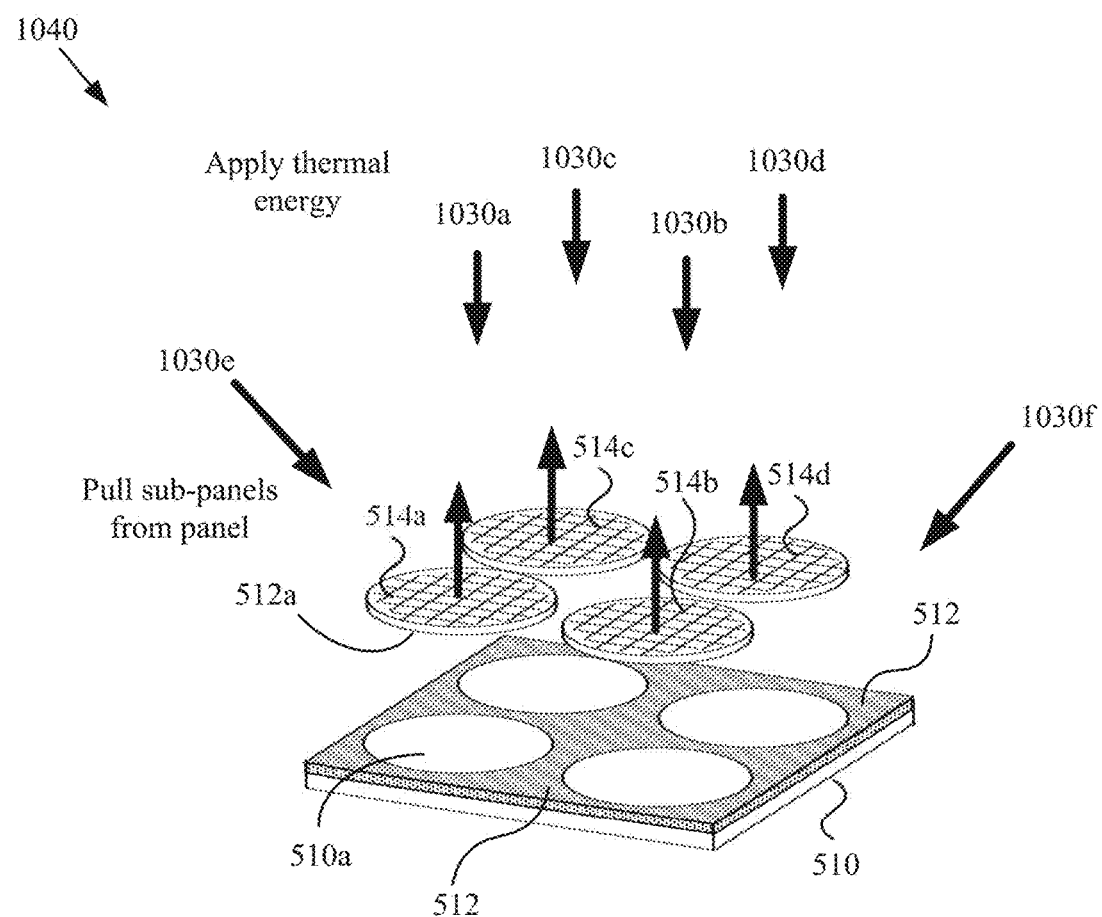
Figure 10C:
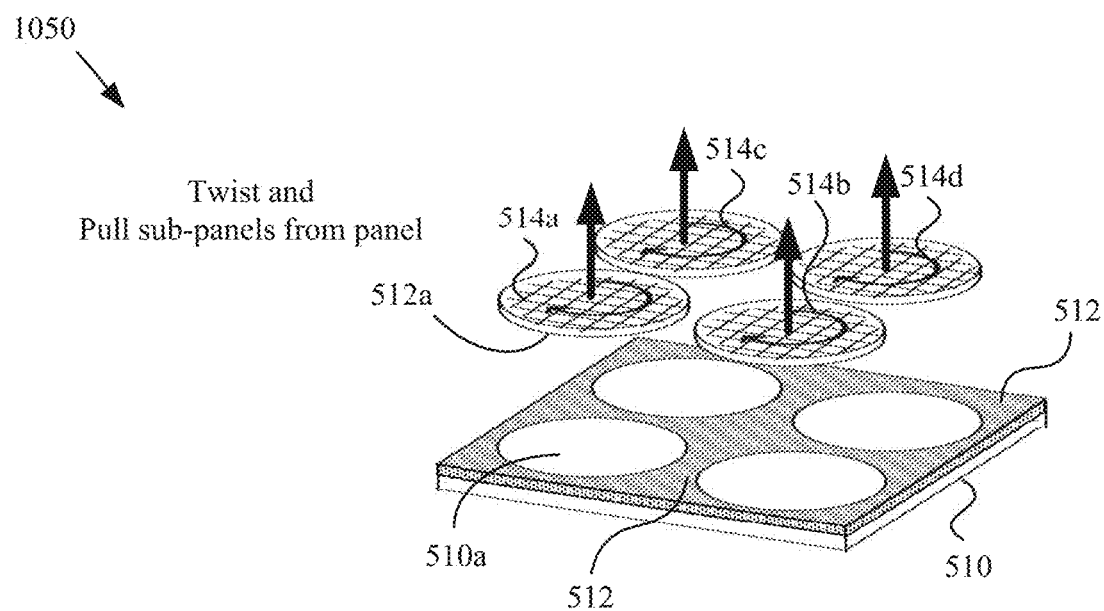

After the processing is performed on the hybrid panel at block 150, the subpanels may be removed from the carrier panel at block 160. In some implementations, such subpanels can comprise or correspond to the subpanels of FIGS. 2-3, the subpanels 415, 425, 435, 445, 455, and 465 of FIG. 4, or other subpanels disclosed herein, or such carrier panel can comprise or correspond to other carrier panels disclosed herein. Such subpanel removal may be performed in any of a variety of manners. FIGS. 10A-10C provide examples of different methods of removing the subpanels from the carrier panel.

For example, as discussed herein, for example during the discussion of block 140, a light-releasable adhesive may be utilized to mount subpanels to a carrier panel, to mount subpanels to respective inserts, etc. FIG. 10A shows a method of removing subpanels (e.g., from a carrier panel, from an insert, etc.) that utilizes light energy (e.g., UV energy, etc.) to release adhesive material.

For example, at view 1010, light energy signified by arrows 1010a, 1010b, 1010c, and 1010d is applied to irradiate the adhesive material 512 through a transparent (e.g., glass, etc.) carrier panel 510. In some examples, the light energies 1010a, 1010b, 1010c, and 1010d can be applied through the carrier panel 510 concurrently to respective subpanels 514a, 514b, 514c, and 514d. In some examples, the light energies 1010a, 1010b, 1010c, and 1010d can be applied through the carrier panel 510 sequentially to respective subpanels 514a, 514b, 514c, and 514d. In some examples, light energy can be applied through an area of the carrier panel 510 (e.g., in a single beam, aggregating multiple beams, etc.) corresponding to (e.g., including, including as a subset, etc.) the combined respective footprints of the subpanels 514a, 514b, 514c, and 514d. Light energy may also, for example, be applied to the adhesive material 512 that is on the carrier panel 510 but outside of the footprints of the subpanels 514a-514d. The light energy that reaches the adhesive material 512 through the carrier panel 510 (e.g., the amount of which depends on the energy of the light applied to the carrier panel 510, the transmittance of the carrier panel 510, etc.) acts to reduce or eliminate the adhesiveness of the adhesive material 512.

As shown at view 1020, once the adhesiveness of the adhesive material 512 has been eliminated or reduced below a particular level, the subpanels 514a, 514b, 514c, and 514d may be removed (e.g., pulled, lifted, or sheared) from the carrier 512. In the example view 1020, a respective portion of the adhesive 512 coupled to each of the subpanels 514a, 514b, 514c, and 514d pulls away from the carrier panel 510 and remains coupled to the bottom sides of the subpanels 514a, 514b, 514c, and 514d. For example, when subpanel 514a is pulled from the carrier panel 510, a portion 512a of the adhesive 512 pulls away from the carrier panel 510 and remains coupled to the bottom side of the subpanel 514a. The pulling away of the portion 512a of the adhesive 512 leaves a void 510a (or aperture), which exposes a respective portion 510a of the carrier panel 510 through the adhesive 512. Similarly, respective adhesive portions and voids correspond to the pulled-away subpanels 514b, 514c, and 514d. Note that in another example, after the subpanels 514a, 514b, 514c, and 514d are pulled from the carrier panel 510, a respective first portion of the adhesive 512 may be coupled to a respective bottom side of each of the subpanels 514a, 514b, 514c, and 514d, and a respective second portion of the adhesive 512 may remain coupled to the carrier panel 510. For example, a portion of the adhesive 512 may remain in the void 510a instead of being pulled up with the subpanel 512a. In still another example, none of the adhesive 512 is pulled up with the subpanels 514a, 514b, 514c, and 514d, and all of the adhesive 512 remains on the carrier panel 510. Any remnants of the adhesive 512 coupled to the subpanels 514a, 514b, 514c, and 514d may be removed from the subpanels 514a, 514b, 514c, and 514d, and any remnant of the adhesive 512 may also be removed from the carrier panel 510 so that the carrier panel 510 may be reused.

As also discussed herein, for example during the discussion of block 140, a thermal-releasable adhesive may be utilized to mount subpanels to a carrier panel, to mount subpanels to respective inserts, etc. FIG. 10B shows a method of removing subpanels (e.g., from a carrier panel, from an insert, etc.) that utilizes thermal energy (e.g., heat energy) to release adhesive material.

For example, at view 1030, thermal energy signified by arrows 1030a, 1030b, 1030c, 1030d, 1030e, and 1030f is applied to heat the adhesive material 512. Such thermal energy may, for example, be applied from any or all directions. The thermal energy that reaches the adhesive material 512 (e.g., directly from above, from above and through the subpanels 514a, 514b, 514c, and 514e, from below and through the carrier panel 510, etc.) acts to reduce or eliminate the adhesiveness of the adhesive material 512.

As shown at view 1040, once the adhesiveness of the adhesive material 512 has been eliminated or reduced below a particular level, the subpanels 514a, 514b, 514c, and 514d may be removed (e.g., pulled, lifted, or sheared) from the adhesive 512. Any remnants of the adhesive 512 may be removed from the subpanels 514a, 514b, 514c, and 514d, and the adhesive 512 may also be removed from the carrier panel 510 so that the carrier panel 510 may be reused. As discussed herein with regard to FIG. 10A, respective portions of the adhesive 512 may remain in contact with the subpanels 514a, 514b, 514c, and 514d or with the carrier panel 510.

As shown at view 1050 of FIG. 10C, an additional technique that may be applied (e.g., independently, in conjunction with the application of light energy to the adhesive, in conjunction with the application of thermal energy to the adhesive, etc.) includes rotating (or twisting) the subpanels 514a, 514b, 514c, and 514d while pulling the subpanels 514a, 514b, 514c, and 514d from the adhesive 512 (e.g., with a top chuck). Such a technique (e.g., utilizing rotation of the subpanels 514a, 514b, 514c, and 514d instead of translation (e.g., sliding, shearing, etc.) may be advantageous, for example when the processing results in material being formed directly laterally between the subpanels 514a, 514b, 514c, and 514d (e.g., as discussed herein with regard to block 150), when other subpanels obstruct lateral translational motion of a subpanel being removed, when any other obstacle obstructs lateral translational motion of a subpanel being removed, etc. As discussed herein with regard to FIG. 10A, respective portions of the adhesive 512 may remain in contact with the subpanels 514a, 514b, 514c, and 514d or with the carrier panel 510.

In various example implementations, block 160 may also comprise cutting along the perimeters of the subpanels. Examples of such cutting are provided at FIGS. 11A and 11B, which show example methods of (and apparatus for) cutting dielectric or conductive material around a subpanel, and example electronic devices produced thereby. Such cutting may, for example, enhance the removability of the subpanels from the carrier panel.

Figure 11A:
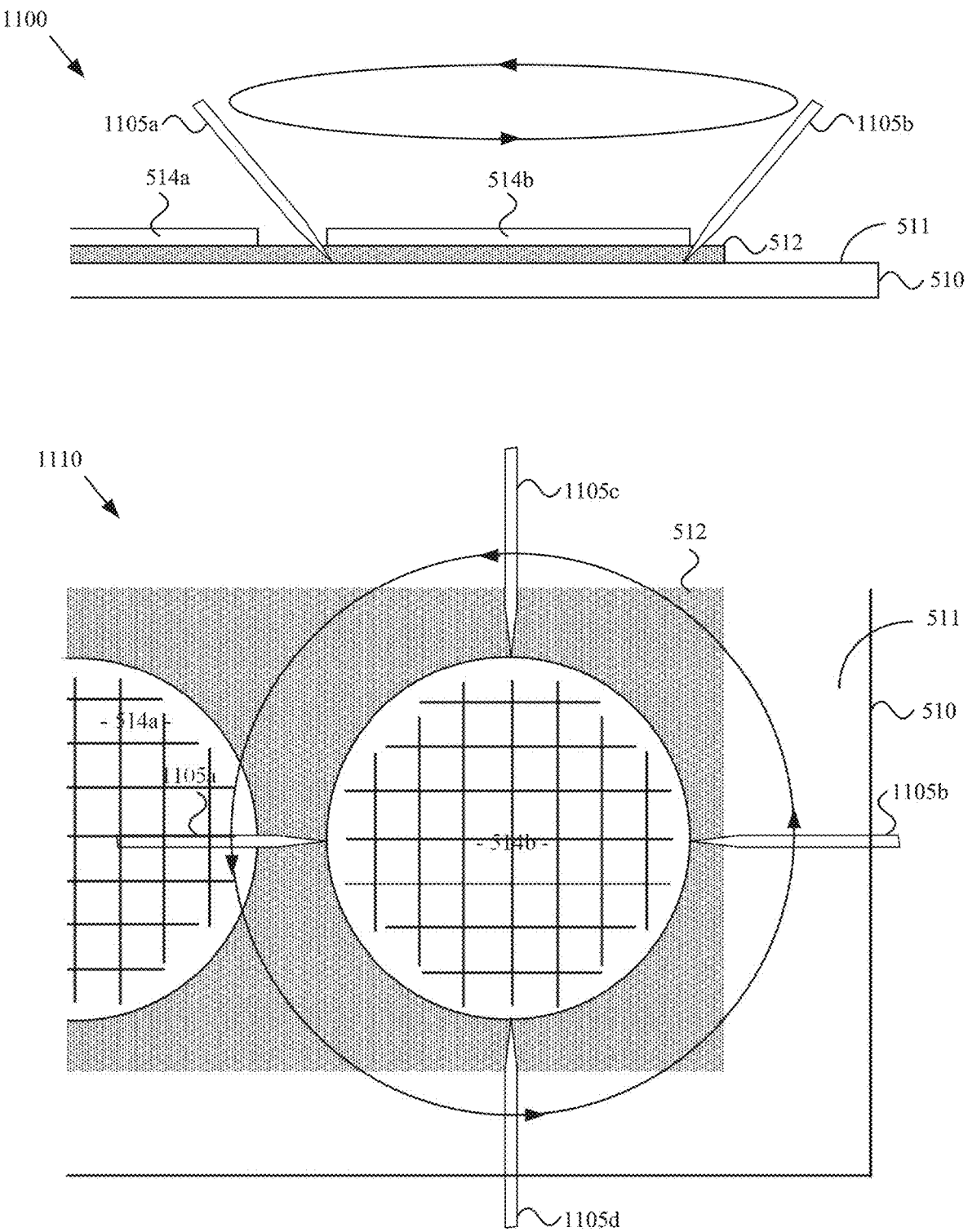
FIGS. 11A-11B show example methods of (and apparatus for) cutting dielectric or conductive materials around a subpanel, and example electronic devices produced thereby.
Figure 11B:
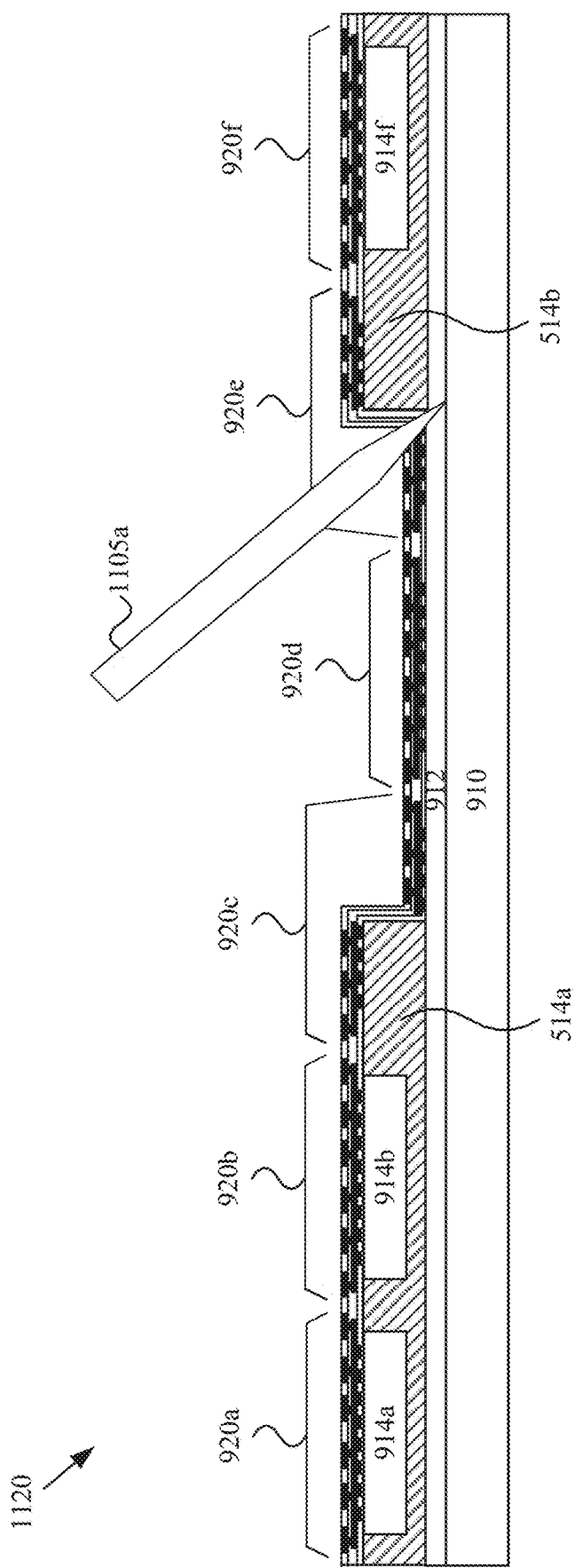

More specifically, FIG. 11A shows a vertical cross-sectional view and FIG. 11B shows a top view of a cutting method and apparatus therefor. For example, one or more cutting blades 1105a, 1105b, 1105c, or 1105d can cut by traversing or rotating around the perimeter of the subpanel 514b. Although the example subpanels 514a and 514b shown in FIG. 11A (and other figures herein) are round, there can be examples where one or more cutting blades 1105a, 1105b, 1105c, 1105d cut around the perimeter of a non-circular (e.g., rectangular, etc.) subpanel. Although multiple cutting blades 1105a, 1105b, 1105c, 1105d are presented, there can be implementations that use a single cutting blade or a different number of cutting blades than the number shown.

The cutting blades 1105a, 1105b, 1105c, or 1105d may, for example, cut through processing materials formed after or during the mounting of the subpanel 514b on the carrier panel 510 (e.g., at block 140, at block 150, etc.). Examples of such materials are shown at FIGS. 9A-9E, and may for example correspond to any of a variety of materials that may correspond to any or all of the processing that may be performed at block 150. For example in the examples shown in FIGS. 9A-9E, a portion of which is shown at FIG. 11B, such materials can comprise or correspond to a plurality of dielectric or conductive layers covering top or lateral surfaces of the subpanels 514a, 514b, 514c, and 514d and covering the carrier panel 510 and adhesive material 512 laterally between (e.g., directly laterally between, etc.) the subpanels 514a, 514b, 514c, and 514d. As shown in the view 1120 of FIG. 11B, the cutting blade 1105a cuts through such dielectric and conductive materials (or layers) formed during the process of forming the signal redistribution structure (e.g., as shown in detail at FIG. 9A). Cutting such materials degrades or eliminates the capability of such materials to hold the subpanels 514a, 514b, 514c, and 514d to the carrier panel 510 and adhesive material 512.

As shown in FIG. 11A, during the application of the adhesive material 512 to the carrier panel 510, a perimeter border region 511 of the top side of the carrier panel 510 may be left free of the adhesive material 512. Such a border region may, for example, be utilized for the alignment of or for securing the hybrid panel during processing (e.g., during the processing of block 150, during the removal of the subpanels from the panel at block 160, during the cutting operation, etc.). For example, during processing, the hybrid panel may be clamped as opposed to the subpanels being clamped. Additionally, for alignment purposes, fiducials or other markings may be formed or located in the perimeter border region 511 (e.g., not obscured by the adhesive material 512 or by the subpanels 514a, 514b, 514c, and 514d).

Although mechanical cutting is shown in the examples of FIGS. 11A and 11B, depending on the nature of the materials being cut, cutting blades 1105a, 1105b, 1105c, and 1105d can comprise energy cutting blades (e.g., laser cutting, soft beam cutting, plasma cutting, etc.) or other forms of cutting blades (e.g., liquid jet cutting, etc.).

Note that although the examples shown in FIGS. 11A and 11B show a single subpanel being processed, any portion or all of the subpanels on a panel may be processed simultaneously (e.g., utilizing multiple chucks, a single chuck with multiple cutting apparatuses, etc.).

In general, block 160 may comprise cutting along the perimeters of the subpanels (e.g., to enhance the removability of the subpanels from the carrier panel, etc.). Accordingly, the scope of this disclosure is not limited by characteristics of any particular manner of performing such cutting.

In general, block 160 may comprise removing the subpanels from the carrier panel. Accordingly, the scope of this disclosure should not be limited by characteristics of any particular manner of removing the subpanels from the carrier panel.

After block 160, the example method may comprise performing additional processing. Block 160 may comprise performing any of a variety of additional processing steps (e.g., forming redistribution structures, forming interconnection structures (e.g., bumps, pillars or posts, conductive balls, etc.), 3D stacking of components, singulating, encapsulating, wirebonding, die mounting, cleaning, testing, etc. Such continued processing may, for example, comprise performing additional processing steps on the removed subpanels (e.g., sequentially, in parallel, etc.). Such continued processing may also, for example, comprise directing execution flow of the example method 100 back to any previous step (e.g., to step 105, etc.).

This disclosure has provided many examples of methods of manufacturing an electronic device, apparatus for performing such methods, electronic devices resulting from the performing of such methods, etc.

For example, an example method of manufacturing an electronic device has been shown, where the method comprises: receiving a panel; receiving a plurality of subpanels, wherein each of the subpanels comprising a plurality of semiconductor dies; forming a hybrid panel by, at least in part, mounting the subpanels to a top side of the panel; processing the hybrid panel, where the processing comprising simultaneously performing a processing step on the subpanels of the hybrid panel; and after the processing, removing the subpanels from the top side of the panel.

For example, the subpanels may be circular and the panel may be rectangular. Also for example, the top side of the panel below and between the subpanels may comprise a cut-out. Additionally for example, the simultaneously performing a processing step on the subpanels may comprise simultaneously applying a material to a top side of the subpanels and to the top side of the panel laterally between adjacent ones of the subpanels. The processing step may, for example, comprise forming a conductive seed layer. The processing step may also, for example, comprise forming a conductive seed layer on a respective lateral side of each of the subpanels. The processing may, for example, comprise forming a respective signal distribution structure for each of the semiconductor dies. During the forming of the signal distribution structures, a portion of metal material applied to form the signal distribution structures may be applied laterally between the subpanels. Further for example, the removing of the subpanels from the panel may comprise rotating and pulling each of the subpanels.

Additionally for example, another example method of manufacturing an electronic device has been shown. The example method may comprise: receiving a panel; receiving a plurality of subpanels, where each of the subpanels comprises a plurality of semiconductor dies; forming a hybrid panel by, at least in part, mounting the subpanels to a top side of the panel; processing the hybrid panel, where the processing comprises forming a respective signal distribution structure for each of the semiconductor dies; and after the processing, removing the subpanels from the top side of the panel.

For example, the respective signal distribution structure for each of the semiconductor dies may comprise a respective die conductor pattern, and the processing of the hybrid panel may comprise forming a sacrificial conductor pattern laterally between the respective die conductor patterns. The sacrificial conductor pattern may, for example, be at least 25% identical to one or more of the respective die conductor patterns. The sacrificial conductor pattern may, for example, have a top surface area that is within 25% of a top surface area of at least one of the die conductor patterns. At least part of the sacrificial conductor pattern may, for example, be on one of the subpanels. At least part of the sacrificial conductor pattern may, for example, be on the panel and laterally between adjacent ones of the subpanels. For example, at least part of the sacrificial conductor pattern may be on a first subpanel of the plurality of subpanels, and at least part of the sacrificial conductor pattern is on the panel and laterally between the first subpanel and a second subpanel of the plurality of subpanels. Also for example, the forming of a respective signal distribution structure for each of the semiconductor dies may comprise forming a conductive material, and the processing of the hybrid panel may comprise forming a portion of the conductive material on a respective lateral surface of each of the subpanels.

Further for example, another example method of manufacturing an electronic device has been shown. The example method may comprise: receiving a panel; receiving a plurality of subpanels, where each of the subpanels comprises a plurality of semiconductor dies; forming a hybrid panel by, at least in part, mounting the subpanels to a top side of the panel; processing the hybrid panel; and after said processing the hybrid panel, removing the subpanels from the panel by, at least in part, rotating each of the subpanels.

For example, the removing of the subpanels may comprise simultaneously rotating and pulling a first subpanel of the subpanels (or a plurality or all of such subpanels). Also for example, the removing of the subpanels may comprise simultaneously rotating and applying heat or light energy to a first subpanel of the subpanels (or a plurality or all of such subpanels). Additionally for example, the removing of the subpanels may comprise simultaneously rotating a first subpanel of the subpanels and a second subpanel of the subpanels (or all of such subpanels).

The discussion herein included numerous illustrative figures that showed various methods of manufacturing an electronic device, various apparatuses for performing such methods, and various electronic devices (or portions thereof) resulting from performing such methods. For illustrative clarity, such figures did not show all aspects of each of the example methods, apparatuses, or electronic devices. Any of the example methods, apparatuses, or electronic devices presented herein may share any or all characteristics with any or all of the other example methods, apparatuses, or electronic devices presented herein.

While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A method of manufacturing an electronic device, the method comprising:
   receiving a panel;
   receiving a plurality of subpanels, each of the subpanels comprising a plurality of semiconductor dies;
   forming a hybrid panel by, at least in part, mounting the subpanels to a top side of the panel;
   applying a material to a top side of the subpanels and to a portion of the top side of the panel, wherein the portion is laterally between adjacent ones of the subpanels; and
   after applying the material, removing the subpanels from the top side of the panel.

2. The method of claim 1, wherein the subpanels are circular and the panel is rectangular.

3. The method of claim 1, wherein the top side of the panel comprises apertures below the subpanels.

4. The method of claim 1, wherein applying the material comprises forming a conductive seed material.

5. The method of claim 1, wherein applying the material comprises forming a conductive seed material on a respective lateral side of each of the subpanels.

6. The method of claim 1, comprising: forming a respective signal distribution structure for each of the semiconductor dies;
   wherein forming the respective signal distribution structure comprises applying the material.

7. The method of claim 6, wherein forming of the signal distribution structures comprises applying a metal material over the subpanels and the portion of the top side of the panel that is laterally between adjacent ones of the subpanels.

8. The method of claim 1, wherein removing the subpanels from the panel comprises rotating and pulling each of the subpanels with respect to the panel.

9. A method of manufacturing an electronic device, the method comprising:
   receiving a panel;
   receiving a plurality of subpanels, each of the subpanels comprising a plurality of semiconductor dies;
   forming a hybrid panel by, at least in part, mounting the subpanels to a top side of the panel;
   forming a signal distribution structure on the subpanels and on portions of the top side of the panel between the subpanels, wherein the signal distribution structure comprises:
      a respective die conductor pattern for each of the semiconductor dies; and
      a sacrificial conductor pattern on the portions of the top side of the panel between the subpanels; and
   after forming the signal distribution structure, removing the subpanels from the top side of the panel.

10. The method of claim 9, wherein the sacrificial conductor pattern is at least 25% identical to one or more of the respective die conductor patterns.

11. The method of claim 9, wherein the sacrificial conductor pattern has a top surface area that is within 25% of a top surface area of at least one of the die conductor patterns.

12. The method of claim 9, wherein at least part of the sacrificial conductor pattern is on one of the subpanels.

13. The method of claim 9, wherein said forming the signal distribution structure comprises forming a conductive material on a respective lateral surface of each of the subpanels.

14. A method of manufacturing an electronic device, the method comprising:
   receiving a panel;
   receiving a plurality of subpanels, each of the subpanels comprising a plurality of semiconductor dies;
   forming a hybrid panel by, at least in part, mounting the subpanels to a top side of the panel;
   processing the hybrid panel; and after said processing the hybrid panel, removing the subpanels from the panel by, at least in part, rotating each of the subpanels.

15. The method of claim 14, wherein said removing the subpanels comprises simultaneously rotating and pulling a first subpanel of the subpanels.

16. The method of claim 14, wherein said removing the subpanels comprises simultaneously rotating and applying heat or light energy to a first subpanel of the subpanels.

17. The method of claim 14, wherein said removing the subpanels comprises simultaneously rotating a first subpanel of the subpanels and a second subpanel of the subpanels.

* * * * *